(12) United States Patent
Chang et al.

(10) Patent No.: US 10,784,427 B2
(45) Date of Patent: Sep. 22, 2020

(54) LIGHT-EMITTING DIODE DEVICE

(71) Applicant: EPISTAR CORPORATION, Hsinchu (TW)

(72) Inventors: Li-Ming Chang, Hsinchu (TW); Tzung-Shiun Yeh, Hsinchu (TW); Chien-Fu Shen, Hsinchu (TW); Yu-Rui Lin, Hsinchu (TW); Chen Ou, Hsinchu (TW); Hsin-Ying Wang, Hsinchu (TW); Hui-Chun Yeh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/579,218

(22) Filed: Sep. 23, 2019

(65) Prior Publication Data
US 2020/0020839 A1 Jan. 16, 2020

Related U.S. Application Data

(63) Continuation of application No. 15/874,501, filed on Jan. 18, 2018, now Pat. No. 10,505,092.
(Continued)

(51) Int. Cl.
*H01L 33/62* (2010.01)
*H01L 33/20* (2010.01)
(Continued)

(52) U.S. Cl.
CPC .............. *H01L 33/62* (2013.01); *H01L 33/20* (2013.01); *F21K 9/232* (2016.08);
(Continued)

(58) Field of Classification Search
CPC ......... H01L 33/44; H01L 33/06; H01L 33/32; H01L 33/145; H01L 33/42; H01L 33/62; H01L 33/38; H01L 33/24
See application file for complete search history.

(56) References Cited

U.S. PATENT DOCUMENTS 9,768,227 B2 9/2017 Ou et al.
9,905,729 B2 2/2018 Kim et al.
(Continued)

FOREIGN PATENT DOCUMENTS

TW 201508947 A 3/2015
TW 201513396 A 4/2015
(Continued)

*Primary Examiner* — Kyoung Lee
*Assistant Examiner* — Christina A Sylvia
(74) *Attorney, Agent, or Firm* — Ditthavong & Steiner P.C.

(57) ABSTRACT

A light-emitting device includes a first edge to a fourth edge; a semiconductor stack formed on a substrate, including a first semiconductor layer, a second semiconductor layer and an active layer; a first electrode formed on the first semiconductor layer, including a first pad electrode and a first finger electrode; and a second electrode formed on the second semiconductor layer, including a second pad electrode and a second finger electrode; wherein the first finger electrode is disposed at and along the first edge; and the first finger electrode includes a first overlapping portion overlapping the second finger electrode; the second finger electrode includes a second overlapping portion overlapping the first finger electrode and a non-overlapping portion that does not overlap the first finger electrode; and the second overlapping portion is not parallel with the first overlapping portion and the non-overlapping portion is not parallel with the first edge.

20 Claims, 18 Drawing Sheets

Related U.S. Application Data

(60) Provisional application No. 62/449,856, filed on Jan. 24, 2017, provisional application No. 62/607,689, filed on Dec. 19, 2017.

(51) Int. Cl.

| | |
|---|---|
| H01L 33/06 | (2010.01) |
| H01L 33/30 | (2010.01) |
| F21Y 115/10 | (2016.01) |
| H01L 33/22 | (2010.01) |
| H01L 23/60 | (2006.01) |
| F21K 9/232 | (2016.01) |
| H01L 33/32 | (2010.01) |
| H01L 33/00 | (2010.01) |
| H01L 33/38 | (2010.01) |
| H01L 33/14 | (2010.01) |

(52) U.S. Cl.
CPC ........... *F21Y 2115/10* (2016.08); *H01L 23/60* (2013.01); *H01L 33/0016* (2013.01); *H01L 33/06* (2013.01); *H01L 33/14* (2013.01); *H01L 33/22* (2013.01); *H01L 33/30* (2013.01); *H01L 33/32* (2013.01); *H01L 33/38* (2013.01)

(56) References Cited

U.S. PATENT DOCUMENTS

| | | |
|---|---|---|
| 10,172,190 B2 * | 1/2019 | Kim ...................... H01L 33/382 |
| 2012/0049223 A1 | 3/2012 | Yang et al. |
| 2014/0367720 A1 | 12/2014 | Kim et al. |
| 2015/0076445 A1 | 3/2015 | Tsou |
| 2015/0076536 A1 | 3/2015 | Ou et al. |
| 2016/0247989 A1 * | 8/2016 | Jin ......................... H01L 33/38 |
| 2017/0125640 A1 | 5/2017 | Kim et al. |

FOREIGN PATENT DOCUMENTS

| | | | |
|---|---|---|---|
| WO | 2016182248 A1 | 11/2016 | |
| WO | WO-2016182248 A1 * | 11/2016 | ............. H01L 33/38 |

\* cited by examiner

| Layout | Comparative Example | Second Embodiment | Variant Example A |
|---|---|---|---|
| Power(mW) | 42.68 | 43.16 | 42.99 |
| ΔPower(%) | Ref. | 1.125 | 0.726 |
| Vf(V) | 2.852 | 2.859 | 2.827 |

FIG. 10

LIGHT-EMITTING DIODE DEVICE

CROSS-REFERENCE TO RELATED APPLICATIONS

This application is a continuation of U.S. patent application Ser. No. 15/874,501, filed Jan. 18, 2018, which claims priority to and the benefit of U.S. provisional application No. 62/449,856 filed on Jan. 24, 2017 and U.S. provisional application No. 62/607,689 filed on Dec. 19, 2017, each of which is incorporated by reference herein in its entirety.

BACKGROUND

Technical Field

The present disclosure relates to a light-emitting device, more particularly, to a light-emitting device with uniform current spreading and improved brightness.

Description of the Related Art

The light-emitting diodes (LEDs) of the solid-state lighting elements have the characteristics of low power consumption, low heat generation, long operation life, crash proof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

A conventional LED basically includes a substrate, an n-type semiconductor layer, an active layer and a p-type semiconductor layer formed on the substrate, and p, n-electrodes respectively formed on the p-type/n-type semiconductor layers. When imposing a certain level of forward voltage to the LED via the electrodes, holes from the p-type semiconductor layer and electrons from the n-type semiconductor layer are combined in the active layer to release light. However, the electrodes shelter light emitted from the active layer, and current may be crowded in semiconductor layers near the electrodes. Thus, an optimized electrode structure is needed for improving brightness, optical field uniformity and lowering an operating voltage of the LED.

SUMMARY

A light-emitting device is disclosed. The light-emitting device includes a first edge, a second edge, a third edge and a fourth edge, wherein the first edge and the third edge are opposite each other, and the second edge and the fourth edge are opposite each other; a substrate; a semiconductor stack formed on the substrate, including a first semiconductor layer, a second semiconductor layer and an active layer formed therebetween; a first electrode formed on the first semiconductor layer, including a first pad electrode and a first finger electrode extending from the first pad electrode; and a second electrode formed on the second semiconductor layer, including a second pad electrode and a second finger electrode extending from the second pad electrode, wherein the first finger electrode is disposed at and along the first edge; and wherein in a top view, the first finger electrode includes a first overlapping portion overlapping the second finger electrode; the second finger electrode includes a second overlapping portion overlapping the first finger electrode and a non-overlapping portion that does not overlap the first finger electrode; and the second overlapping portion is not parallel with the first overlapping portion and the non-overlapping portion is not parallel with the first edge.

A light-emitting device is disclosed. The light-emitting device includes a first edge, a second edge, a third edge and a fourth edge, wherein the first edge and the third edge are opposite each other, and the second edge and the fourth edge are opposite each other; a substrate; a semiconductor stack formed on the substrate, including a first semiconductor layer, a second semiconductor layer and an active layer formed therebetween; a first electrode formed on the first semiconductor layer, including a first pad electrode and a first finger electrode extending from the first pad electrode; and a second electrode formed on the second semiconductor layer, including a second pad electrode and a second finger electrode extending from the second pad electrode, wherein the first finger electrode is disposed at and along the first edge; and wherein in a top view, a distance between the first finger electrode and the second finger electrode increases along a direction from an end of the second finger electrode that connects the second pad electrode toward the second edge.

A light-emitting device is disclosed. The light-emitting device includes a first edge, a second edge, a third edge and a fourth edge, wherein the first edge and the third edge are opposite each other, and the second edge and the fourth edge are opposite each other; a substrate; a semiconductor stack formed on the substrate, including a first semiconductor layer, a second semiconductor layer and an active layer formed therebetween; a transparent conductive layer, formed on the second semiconductor layer; a first electrode formed on the first semiconductor layer, including a first pad electrode and a first finger electrode extending from the first pad electrode; and a second electrode formed on the second semiconductor layer, including a second pad electrode and a second finger electrode extending from the second pad electrode; wherein the first edge and the third edge are longer than the second edge and the fourth edge, and the first finger electrode and the second finger electrode extend toward the fourth edge and the second edge, respectively; wherein in a top view, the first finger electrode is disposed at and along the first edge; the second semiconductor layer includes an contour, and the contour includes a first sub-contour adjacent to and parallel with the first finger electrode and a second sub-contour connecting to the first sub-contour and adjacent to the first edge; and a distance between the transparent conductive layer and the first sub-contour is smaller than a distance between the transparent conductive layer and the second sub-contour.

BRIEF DESCRIPTION OF THE DRAWINGS

FIG. 10 shows test data of optical output power (Po) and the forward voltage (Vf) of the light-emitting devices in accordance with the embodiments of the present application and the light-emitting device of the comparative example.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
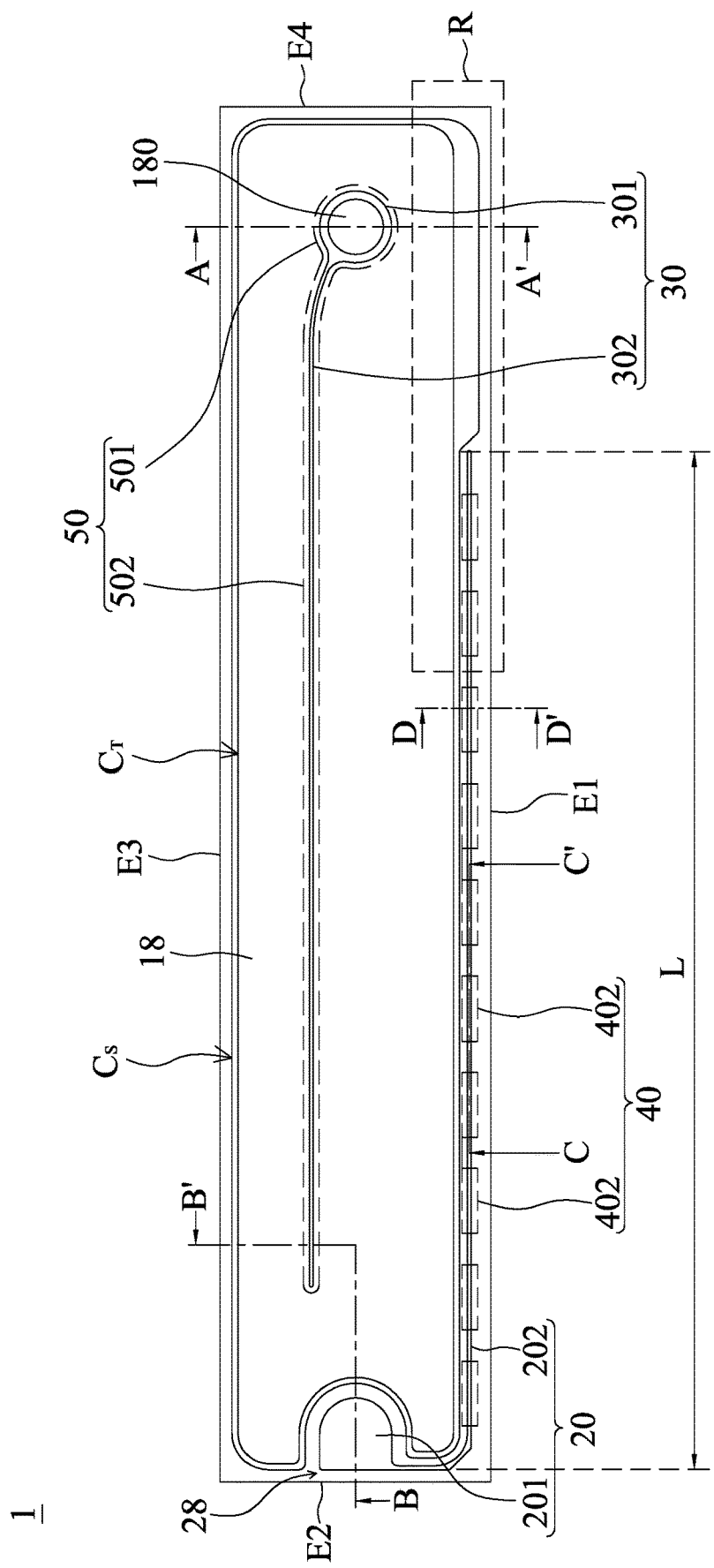
FIGS. 1 and 2A-2E show a light-emitting device 1 in accordance with a first embodiment of the present application.
Figure 2A:
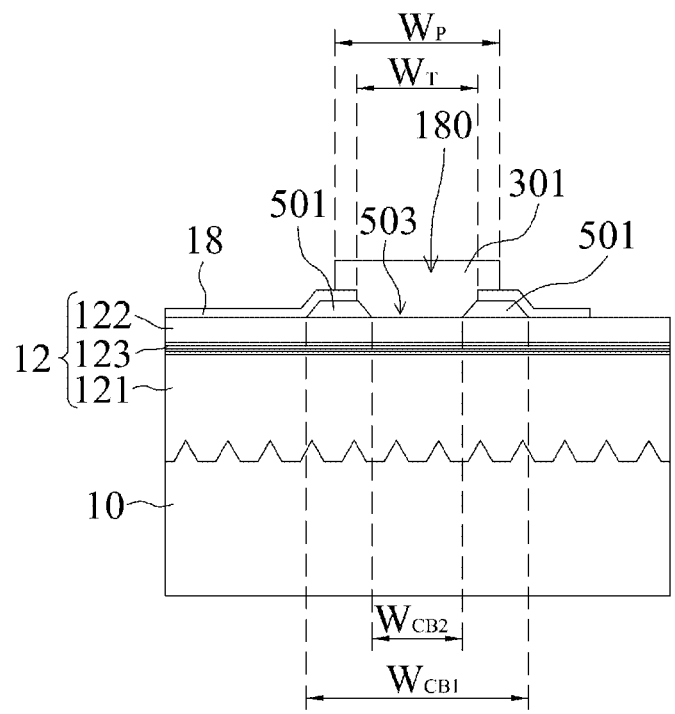
Figure 2B:
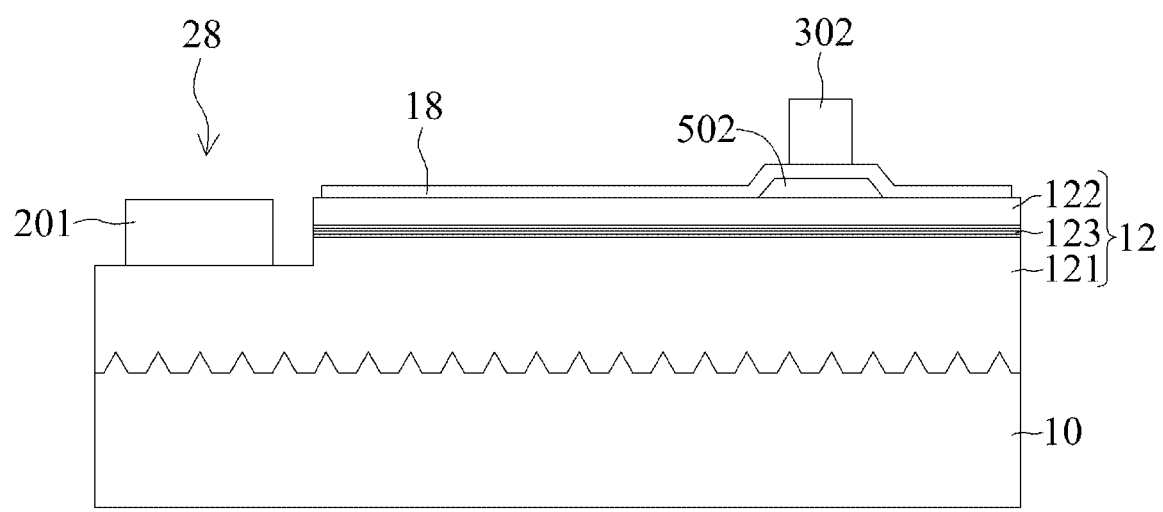
Figure 2C:
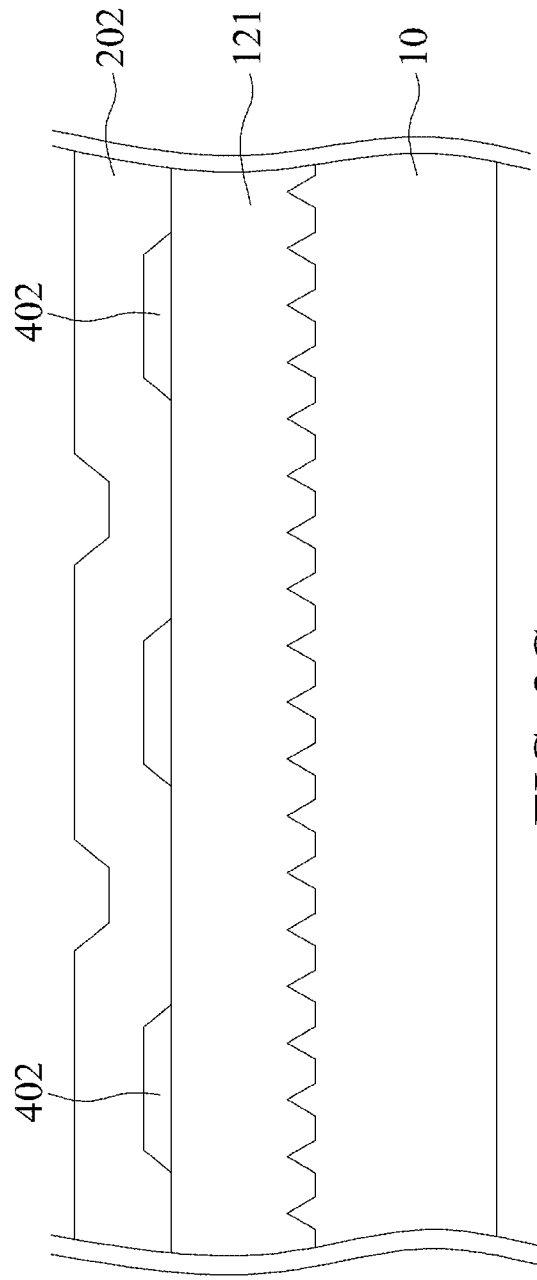
Figure 2D:
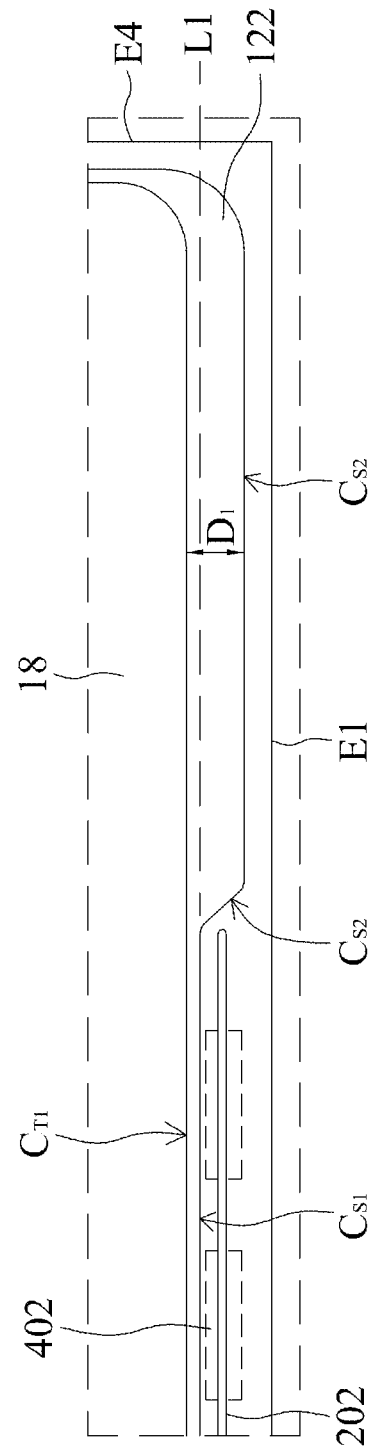
Figure 2E:
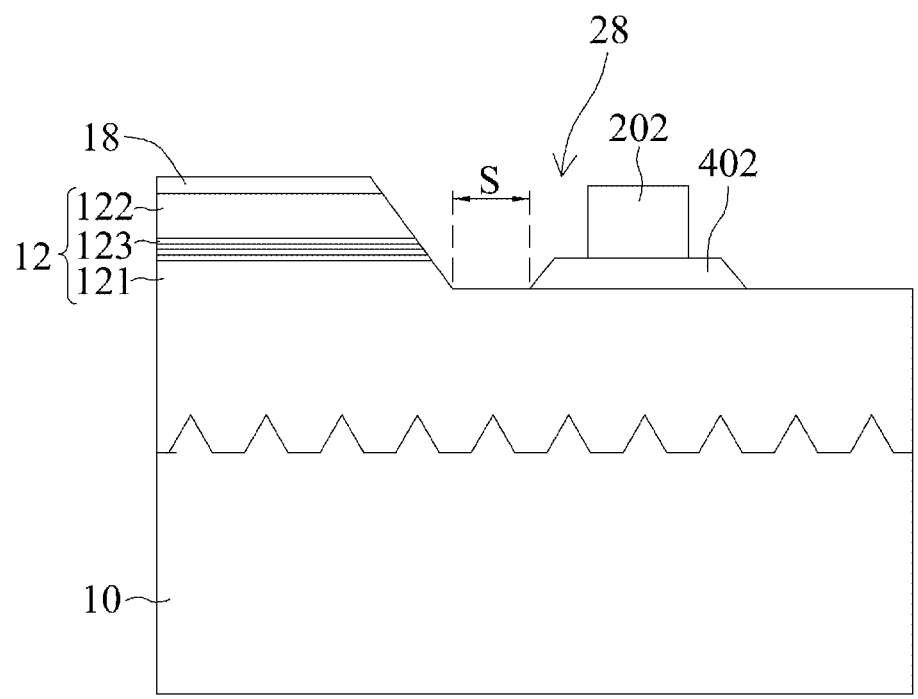

FIG. 1 shows a top view of a light-emitting device 1 in accordance with the first embodiment of the present application. FIG. 2A shows a cross-sectional view taken along the line A-A' of the light-emitting device 1 in FIG. 1; FIG. 2B shows a cross-sectional view taken along the line B-B' of the light-emitting device 1 in FIG. 1; FIG. 2C shows a cross-sectional view taken along the line C-C' of the light-emitting device 1 in FIG. 1; FIG. 2D shows an enlarged view of a region R of the light-emitting device 1 in FIG. 1; and FIG. 2E shows a cross-sectional view taken along the line D-D' of the light-emitting device 1 in FIG. 1.

As shown in FIG. 1 and FIGS. 2A-2C, the light-emitting device 1 includes a substrate 10, a semiconductor stack 12 on the substrate 10, a first and a second current blocking regions 40 and 50 on the semiconductor stack 12, a transparent conductive layer 18 on the semiconductor stack 12, a first electrode 20, a second electrode 30, and a protective layer (not shown) having openings to expose the first electrode 20 and the second electrode 30. The first electrode 20 includes a first pad electrode 201 and a first finger electrode 202 extending therefrom. The second electrode 30 includes a second pad electrode 301 and a second finger electrode 302 extending therefrom.

In the top view shown in FIG. 1, the light-emitting device 1 includes a first edge E1, a second edge E2, a third edge E3 opposite to the first edge E1 and a fourth edge E4 opposite to the second edge E2. The first edge E1 and the third edge E3 are longer than the second edge E2 and the fourth edge E4.

The first pad electrode 201 and the second pad electrode 301 are respectively disposed on regions at two opposite-edge sides of the light-emitting device 1. In one embodiment, the first pad electrode 201 and the second pad electrode 301 are respectively disposed on regions near two opposite edges. In one embodiment, the first pad electrode 201 and the second pad electrode 301 are respectively disposed at two opposite edges. In another embodiment, any or both of the first pad electrode 201 and the second pad electrode 301 can be distant from the two opposite edges with a distance, respectively. In one embodiment, the first pad electrode 201 and/or the second pad electrode 301 are respectively disposed on regions near two opposite edges of the light-emitting device 1, and wherein a shortest distance between each pad electrode and each edge near to the pad electrode is larger than a length of the pad electrode. In one embodiment, a shortest distance between each pad electrode and each edge near to the pad electrode is equal to or smaller than a width of the pad electrode. The first finger electrode 202 extends from the first pad electrode 201 at one of the four edges toward the opposite edge, and the second finger electrode 302 extends from the second pad electrode 301 adjacent the opposite edge toward the edge where the first pad electrode 201 is disposed. To be more specific, as shown in FIG. 1, the first pad electrode 201 is disposed at the second edge E2, and the first finger electrode 202 extends along the second edge E2 and the first edge E1 and points to the fourth edge E4. The second pad electrode 301 is disposed adjacent the fourth edge E4 and is disposed on a midline of the fourth edge. The second finger electrode 302 extends along a direction parallel with the third edge E3 and points to the second edge E2. In another embodiment, the second pad electrode 301 is disposed between the third edge E3 (or the first edge E1) and the midline of the fourth edge.

The substrate 10 can be a growth substrate, including gallium arsenide (GaAs) wafer for growing aluminum gallium indium phosphide (AlGaInP), sapphire ($Al_2O_3$) wafer, gallium nitride (GaN) wafer, silicon carbide (SiC) wafer, or aluminum nitride (AlN) wafer for growing indium gallium nitride (InGaN) or aluminum gallium nitride (AlGaN). The substrate 10 can be a patterned substrate; i.e. the upper surface of the substrate 10 on which the semiconductor stack 12 is epitaxial grown can be with a patterned structure. Lights emitted from the semiconductor stack 12 can be refracted by the patterned structure of the substrate 10 so that the brightness of the LED is improved. Furthermore, the patterned structure retards or restrains the dislocation due to lattice mismatch between the substrate 10 and the semiconductor stack 12 so that the epitaxy quality of the semiconductor stack 12 is improved.

In an embodiment of the present application, the semiconductor stack 12 can be formed on the substrate 10 by organic metal chemical vapor deposition (MOCVD), molecular beam epitaxy (MBE), hydride vapor deposition (HVPE), or ion plating, such as sputtering or evaporation.

The semiconductor stack 12 includes a first semiconductor layer 121, an active layer 123 and a second semiconductor layer 122 sequentially formed on the substrate 10. In an embodiment of the present application, the first semiconductor layer 121 and the second semiconductor layer 122, such as a cladding layer or a confinement layer, have different conductivity types, electrical properties, polarities, or doping elements for providing electrons or holes. For example, the first semiconductor layer 121 is an n-type semiconductor, and the second semiconductor layer 122 is a p-type semiconductor. The active layer 123 is formed between the first semiconductor layer 121 and the second semiconductor layer 122. The electrons and holes combine in the active layer 123 under a current driving to convert electric energy into light energy to emit a light. The wavelength of the light emitted from the light-emitting device 1 or the semiconductor stack 12 is adjusted by changing the physical and chemical composition of one or more layers in the semiconductor stack 12.

The material of the semiconductor stack 12 includes a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer, when the material of the semiconductor stack 12 is AlInGaP series material, red light having a wavelength between 610 nm and 650 nm or yellow light having a wavelength between 550 nm and 570 nm can be emitted. When the material of the semiconductor stack 12 is InGaN series material, blue or deep blue light having a wavelength between 400 nm and 490 nm or green light having a wavelength between 490 nm and 550 nm can be emitted. When the material of the semiconductor stack 12 is AlGaN series material, UV light having a wavelength between 400 nm and 250 nm can be emitted. The active layer 123 can be a single heterostructure (SH), a double heterostructure (DH), a double-side double heterostructure (DDH), or a multi-quantum well structure (MQW). The material of the active layer can be i-type, p-type, or n-type semiconductor.

Besides, a buffer layer (not shown) is formed on the upper surface of the substrate 10 before forming the semiconductor stack 12. The buffer layer can also reduce the lattice mismatch described above and restrain the dislocation so as to improve the epitaxy quality. The material of the buffer layer includes GaN, AlGaN or AlN. In one embodiment, the buffer layer includes a plurality of sub-layers (not shown). The sub-layers include the same material or different material. In one embodiment, the buffer layer includes two sub-layers. The sub-layers include same material AlN. The growth method of the first sub-layer is sputtering, and the growth method of the second sub-layer is MOCVD. In one embodiment the buffer layer further includes a third sub-layer. The growth method of the third sub-layers is MOCVD, and the growth temperature of the second sub-layer is higher than or lower than that of the third sub-layer.

As shown in FIGS. 1 and 2B, an exposed region 28 is formed by etching and removing parts of the second semiconductor layer 122 and the active layer 123 downward to an upper surface of the first semiconductor layer 121. At the exposed region 28, side surfaces of the second semiconductor layer 122 and the active layer 123 and the upper surface of the first semiconductor layer 121 are exposed. In one embodiment, the exposed region 28 is disposed at and extends along the first edge E1 and the second edge E2. The first electrode 20 is disposed on the exposed upper surface of the first semiconductor layer 121 which is part of the exposed region 28, and forms an electrical connection with the first semiconductor layer 121. The second electrode 30 is disposed on the second semiconductor layer 122 and forms an electrical connection with the second semiconductor layer 122.

The material of the first pad electrode 201, the first finger electrodes 202, the second pad electrode 301 and the second finger electrodes 302 are selected from metal, such as Au, Ag, Cu, Cr, Al, Pt, Ni, Ti, Sn, Rh, alloy or stacked composition of the materials described above.

The first current blocking region 40 is formed between the first electrode 20 and the first semiconductor layer 121, and the second current blocking region 50 is formed between the second electrode 30 and the second semiconductor layer 122. In one embodiment, the first current blocking region 40 is formed between the first pad electrode 201 and/or the first finger electrodes 202 and the first semiconductor layer 121. The second current blocking region 50 is formed between the second pad electrode 301 and/or the second finger electrodes 302 and the second semiconductor layer 122. When current is injected into the light-emitting device 1 via the first pad electrode 201 and the second pad electrode 301, the current is spread via the first finger electrode 202 and the second finger electrode 302, and then flows into the transparent conductive layer 18. The first current blocking region 40 and the second current blocking region 50 prevent most parts of the current from directly flowing into the active layer 123 under the electrodes. In other words, the injection current is blocked flowing downward at the regions under the electrodes.

In the embodiment, as shown in FIG. 1, the first current blocking region 40 includes a plurality of separated islands 402 under the first finger electrode 202. The second current blocking region 50 includes a second core region 501 under the second pad electrode 301, and an extending region 502 extending from the second core region 501 and under the second finger electrodes 302. At regions of the second pad electrode 301, the current (electron or hole) is blocked from flowing downward via the second core region 501. The current, spread in the first finger electrodes 202, is blocked from flowing downward via the plurality of separated islands 402, and flows into the first semiconductor layer 121 through regions of the first finger electrodes 202 between two adjacent islands 402. The current, spread in the second finger electrode 302 flows into the transparent conductive layer 18 and is block from flowing downward via the extending region 502 under the second finger electrode 302, and then the current is spread laterally in the transparent conductive layer 18 and then uniformly flow into the semiconductor stack 12.

In another embodiment, similar with the second current blocking region 50, the first current blocking region 40 further includes a first core region (not shown) under the first pad electrode 201. In one embodiment, the first core region (not shown) of the first current blocking region 40 can be larger than or smaller than the first pad electrode 201. In one embodiment, the first core region (not shown) is separated from the plurality of islands 402.

In another embodiment, a first core region (not shown) of the first current blocking region 40 under the first pad electrode 201 connects to one of the islands 402 which is closest to the first pad electrode 201.

In another embodiment, the first current blocking region 40 includes a first core region (not shown) under the first pad electrode 201, but does not include the plurality of islands 402 under the first finger electrode 202.

The material of the first and the second current blocking regions 40 and 50 includes transparent insulated material, such as silicon oxide, silicon nitride, silicon oxynitride, titanium oxide or aluminum oxide. The structure of the current blocking region can be a single layer, multiple layers or alternately multiple layers, such as DBR (distributed Bragg reflector). The thickness of the first current blocking region 40 and the second current blocking region 50 ranges from 700-5000 Å. In one embodiment, the thickness of the first current blocking region 40 and the second current blocking region 50 ranges from 700-1000 Å. In another embodiment, the thickness of the first current blocking region 40 and the second current blocking region 50 ranges from 1000-5000 Å.

The transparent conductive layer 18 is formed on the second current blocking region 50 and the top surface of the second semiconductor layer 122, so that the current injected into the second electrode 30 can be spread uniformly by the transparent conductive layer 18 and then flow into the second semiconductor layer 122. Because the transparent conductive layer 18 is disposed on the light extraction side of the light-emitting device 1, an electrically-conducting material that has transparent property is preferable to be selected. More specifically, the transparent conductive layer 18 can include a thin metal film. The material of the thin metal film can be Ni or Au. The material of the transparent conductive layer 18 can include oxide containing at least one element selected from zinc, indium, or tin, such as ZnO, InO, SnO, ITO (indium tin oxide), IZO (indium zinc oxide), or GZO (gallium-doped zinc oxide).

As shown in FIG. 1, the extending region 502 of the second current blocking region 50 is disposed along the second finger electrode 302 and has a width larger than that of the second finger electrode 302. In one embodiment, the outer contour of the second current blocking region 50 exceeds the contour of the second electrode 30 by 1-10 μm.

In another embodiment, the extending region 502 of the second current blocking region 50 includes a plurality of separated islands (not shown).

As shown in FIG. 2A, the second core region 501 of the second current blocking region 50 includes an opening 503 under the second pad electrode 301. The transparent conductive layer 18 includes an opening 180. The opening 180 corresponds to a location of the second pad electrode 301. In one embodiment, the opening 180 exposes the second semiconductor layer 122 and/or the second core region 501. The second pad electrode 301 contacts the second semiconductor layer 122 via the openings 180 and 503. In this embodiment, the width $W_T$ of the opening 180 of the transparent conductive layer 18 is smaller than the outer width $W_{CB1}$ of the second core region 501 and greater than or equal to the width $W_{CB2}$ of the opening 503 of the second core region 501 so that the transparent conductive layer 18 covers an outer side surface and a top surface of the second core region 501. The transparent conductive layer 18 covers the top surface of the second semiconductor layer 122, the extending regions 502 of the second current blocking region 50 and the top surface of the second core region 501. In one embodiment, the width $W_T$ of the opening 180 of the transparent conductive layer 18 is smaller than the width $W_{CB2}$ of the opening 503 of the second core region 501 so that the transparent conductive layer 18 fills into the opening 503 of the second core region 501.

As shown in FIG. 1, each island 402 has a width larger than that of the first finger electrodes 202 and does not contact the side surfaces of the second semiconductor layer 122 and the active layer 123 at the exposed region 28. The plurality of separated islands 402 is distributed on the first semiconductor layer 121. The first finger electrode 202 formed on the islands 402, and only contacts the first semiconductor layer 121 not covering by the islands 402. Therefore, current is prevented from crowding in a specific region in the semiconductor stack 12 near the first current blocking region 40. In other words, current can be prevented from crowding at the region near the first finger electrodes 202. The spacing between two of the islands 402 and/or the spacing between the islands 402 and the side surface of the exposed region 28 are be designed to improve current spreading in the semiconductor stack 12. In one embodiment, as shown in FIG. 2E, the shortest spacing S between the islands 402 and the side surface of the exposed region 28 is not smaller than 1 μm. The islands 402 are composed of transparent insulated material. In one embodiment, the side surfaces of the islands 402 are inclined to the top surface of the first semiconductor layer 121 at the exposed region 28. In this way, the inclined side surfaces of the islands 402 benefit light extraction. In one embodiment, the spacing between two of the islands 402 and/or the spacing between the islands 402 and the side surface of the exposed region 28 are be designed to enhance light extraction. In one embodiment, when the spacing between the island 402 and the side surface of the exposed region 28 is not smaller than 1 μm, light will be more easily escapes from the semiconductor stack 12. In one embodiment, the island 402 includes a round corner or round edge. The round corner or round edge of the island 402 is also helpful for light extraction.

In another embodiment, the first finger electrode 202 and the second finger electrode 302 have different widths from a top view. In one embodiment, the first finger electrode 202 is wider than the second finger electrode 302.

In another embodiment, the extending region 502 of the second current blocking region 50 and the islands 402 of the first current blocking region 40 have different widths from a top view. In one embodiment, the extending region 502 of the second current blocking region 50 is wider than the island 402 of the first current blocking region 40.

Referring to FIGS. 1, 2A and 2D, parts of the top surface of the second semiconductor layer 122 between the fourth edge E4 and an end of the first finger electrode 202 is not covered by the transparent conductive layer 18. In the top view shown in FIG. 1 and FIG. 2D, the second semiconductor layer 122 includes a contour $C_S$, and the contour $C_S$ includes a first sub-contour $C_{S1}$ adjacent to the first finger electrode 202, and a second sub-contour $C_{S2}$ connecting to the first sub-contour $C_{S1}$ and adjacent to the first edge E1. In one embodiment, the first sub-contour $C_{S1}$ is at the exposed region 28 and is a part of the contour of the exposed region 28. In one embodiment, the first sub-contour $C_{S1}$ is parallel with the first edge E1. The first finger electrode 202 is disposed along the first sub-contour $C_{S1}$. A part of the second sub-contour $C_{S2}$ faces the end of the first finger electrode 202. The dash line L1 in FIG. 2D represents a pseudo extending line that extending from the first sub-contour $C_{S1}$. In the top view, a top surface of the second semiconductor layer 122 between the pseudo extending line L1 and the second sub-contour $C_{C2}$ is not covered by the transparent conductive layer 18.

In the top view shown in FIG. 1 and FIG. 2D, the transparent conductive layer 18 includes a contour $C_T$, and the contour $C_T$ includes a sub-contour $C_{T1}$ adjacent to and parallel with the first sub-contour $C_{S1}$. In one embodiment, a distance between the first sub-contour $C_{S1}$ and the sub-contour $C_{T1}$ and a distance each between the contour $C_S$ and the contour $C_T$ near the second edge E2, the third edge E3 and the fourth edge E4 are substantially the same. A distance D1 between the sub-contour $C_{T1}$ of the transparent conductive layer 18 and the second sub-contour $C_{S2}$ of the second semiconductor layer 122 is different from the distance between the sub-contour $C_{S1}$ and the sub-contour $C_{T1}$ or a distance each between the contour $C_S$ and the contour $C_T$ near edges E2, E3 and E4. In one embodiment, D1 is larger than the distance between the sub-contour $C_{T1}$ and the first sub-contour $C_{S1}$ of the second semiconductor layer 122. In one embodiment, parts of the sub-contour $C_{T1}$ of the transparent conductive layer 18 do not trace the second sub-contour $C_{S2}$ of the second semiconductor layer 122.

In one embodiment, as shown in FIG. 1, the length L at the first edge E1 of the first finger electrode 202 is larger than half a length of the first edge E1.

In another embodiment, the first pad electrode 201 is disposed near one short edge (i.e. the second edge E2). In another embodiment, the first pad electrode 201 can be located near one corner or at one corner of the light-emitting device 1. In one embodiment, the first pad electrode 201 is located near one corner or at one corner adjacent to the second edge E2.

In another embodiment, an area of the transparent conductive layer 18 is smaller than 93% of an area of the second semiconductor layer 122 in a top view.

In one embodiment, the first finger electrode 202 is disposed at and extends along the first edge E1 but does not reach to the fourth edge E4, so the current spreading within the area of the semiconductor stack 12 between the fourth edge E4 and the end of the first finger electrode 202 would be poor and the current density in the area is lower than other areas. In this embodiment, the top surface of the second semiconductor layer 122 in the area with poor current spreading and lower current density is not covered by the transparent conductive layer 18. Current can be confined within an area covered by the transparent conductive layer 18. Thus, the area covered by the transparent conductive layer 18 has higher current density, and current usage efficiency is enhanced. Furthermore, the transparent conductive layer 18 still has an absorption ratio according to light with a specific wavelength. The light emitted from the active layer 123 can be extracted through the area not covered by the transparent conductive layer 18, and the absorption of light due to the transparent conductive layer 18 is reduced. As a result, the brightness of light-emitting device 1 is improved.

Figure 3A:
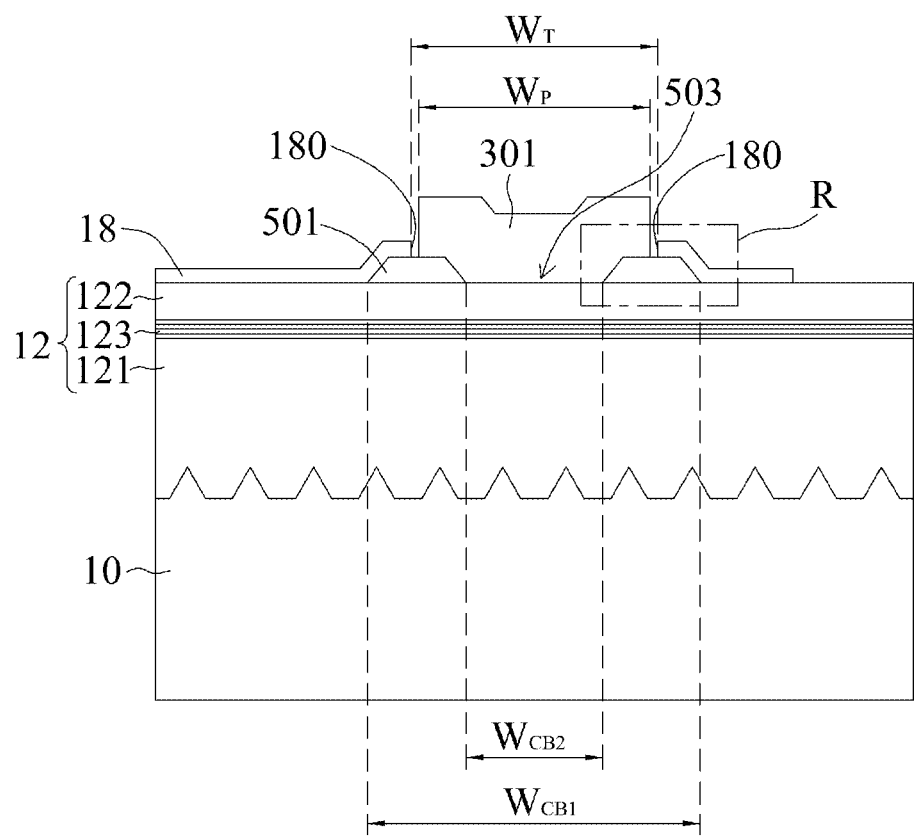
FIGS. 3A-3C respectively show a cross-sectional view along line A-A' of the light-emitting device 1 in FIG. 1, in accordance with different embodiments of the present application.
Figure 3A:
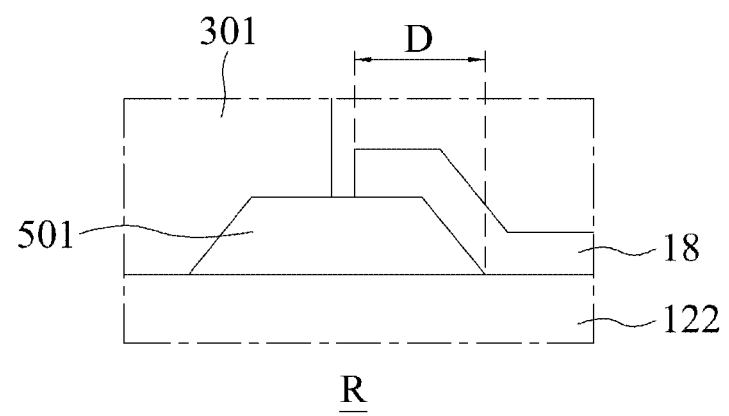
Figure 3B:
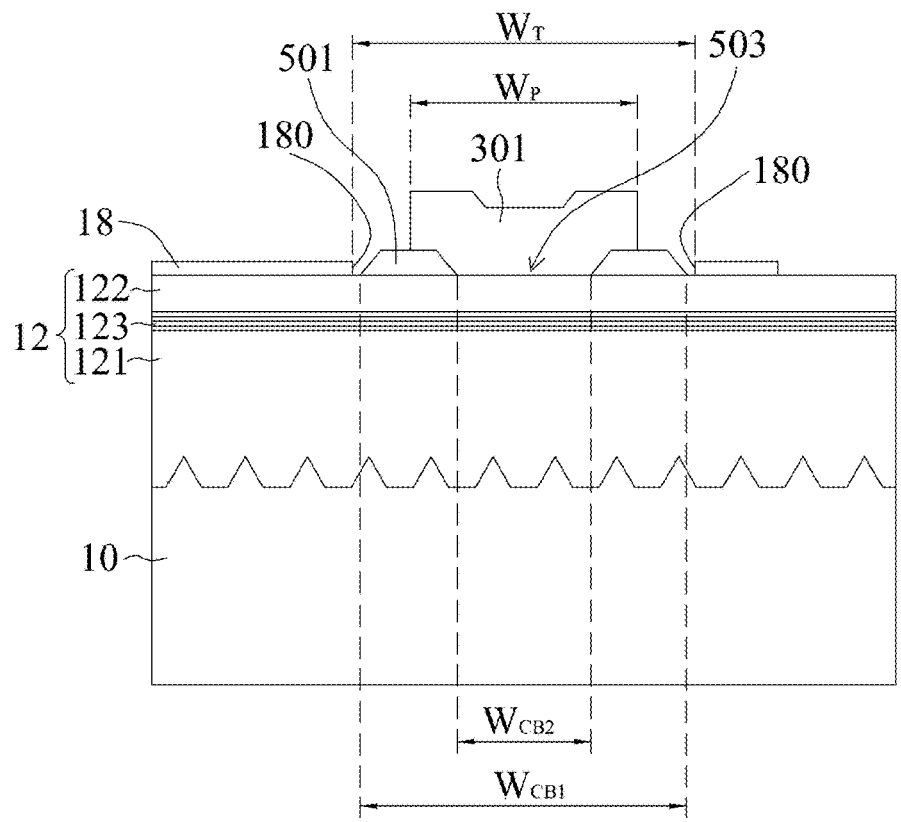
Figure 3C:
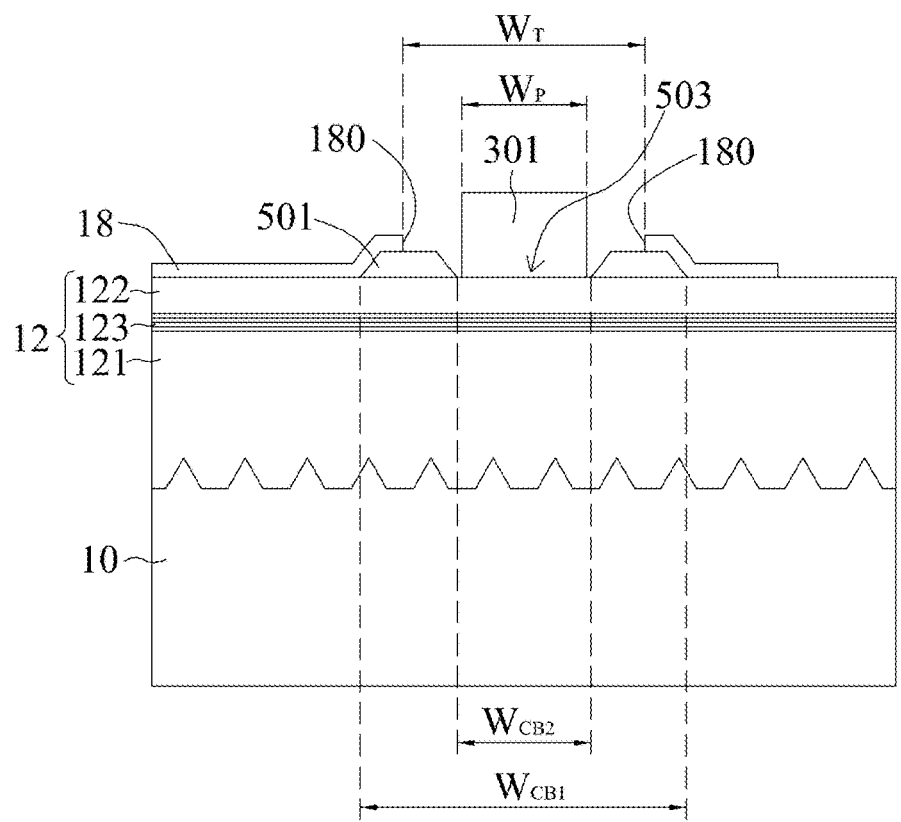

FIGS. 3A to 3C respectively show the cross-sectional views along line A-A' of the light-emitting device 1 in FIG. 1, in accordance with different embodiments of the present application. Moreover, FIG. 3A further shows an enlarged view of the partial region R. The difference between the different embodiments and the first embodiment is the width of the opening 180 of the transparent conductive layer 18.

In one embodiment, as shown in FIG. 3A, the width $W_T$ of the opening 180 of the transparent conductive layer 18 is smaller than the outer width $W_{CB1}$ of the second core region 501 and greater than the width $W_{CB2}$ of the opening 503 of the second core region 501 so that the transparent conductive layer 18 covers outer side surfaces and a partial top surface of the second core region 501. In one embodiment, the width $W_T$ is larger than the width $W_P$ of the second pad electrode 301 so that the transparent conductive layer 18 does not contact the second pad electrode 301. In one embodiment, the width $W_T$ is equal to the width $W_P$ of the second pad electrode 301 so that the transparent conductive layer 18 contacts side surfaces of the second pad electrode 301. In one embodiment, a distance D between an outer edge of the second core region 501 and the opening 180 ranges from 1 to 10 μm.

In one embodiment, as shown in FIG. 3B, the width $W_T$ of the opening 180 of the transparent conductive layer 18 is substantially larger than or equal to the width $W_{CB1}$ of the second core region 501. The transparent conductive layer 18 does not contact side surfaces and the top surface of the second core region 501 or only contact the side surface of the second core region 501. In one embodiment, as shown in FIG. 3C, the width $W_P$ of the second pad electrode 301 is smaller than or substantially equal to the width $W_{CB2}$ of opening 503 of the second core region 501. The second pad electrode 301 contacts neither the transparent conductive layer 18 nor the top surface of the second core region 501.

In one embodiment, the whole bottom area of the second pad electrode 301 contacts the second core region 501 and the second semiconductor layer 122, and adhesion between the second pad electrode 301 and the second current blocking region 50 and/or that between the second pad electrode 301 and the second semiconductor layer 122 is stronger than that between the second pad electrode 301 and the transparent conductive layer 18, so the second pad electrode is prevented from peeling off the light-emitting device. The yield and reliability of the light-emitting device are improved.

Figure 4A:
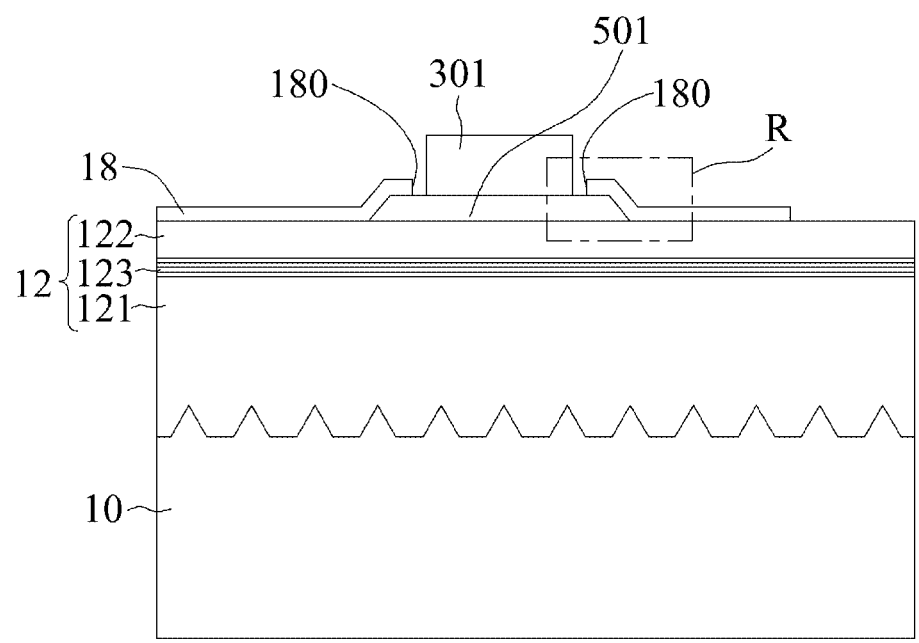
FIGS. 4A-4C respectively show a cross-sectional view along line A-A' of the light-emitting device 1 in FIG. 1, in accordance with different embodiments of the present application.
Figure 4A:
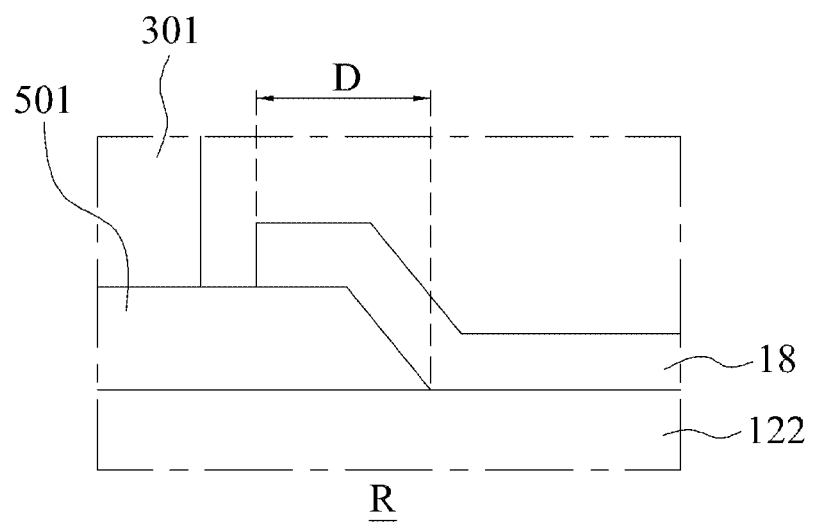
Figure 4B:
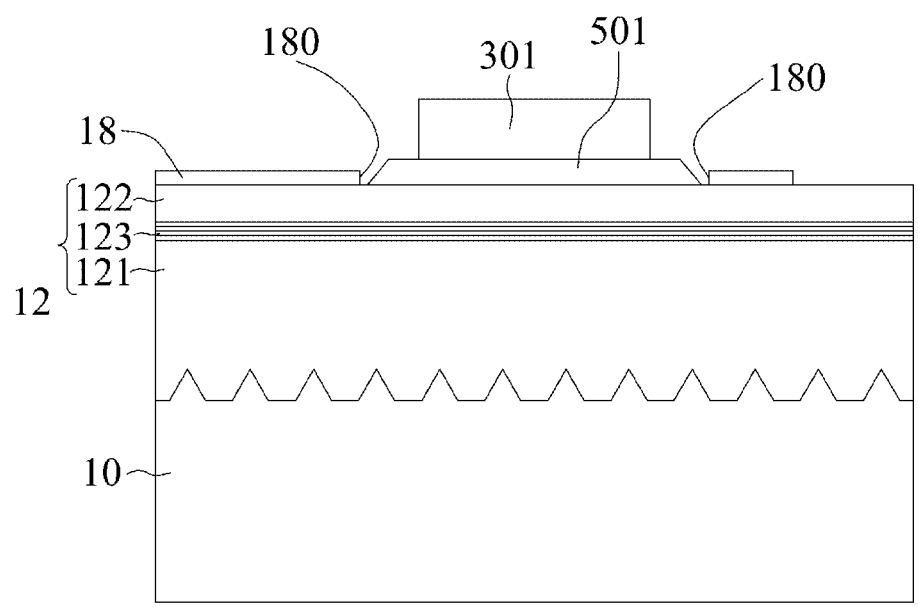
Figure 4C:
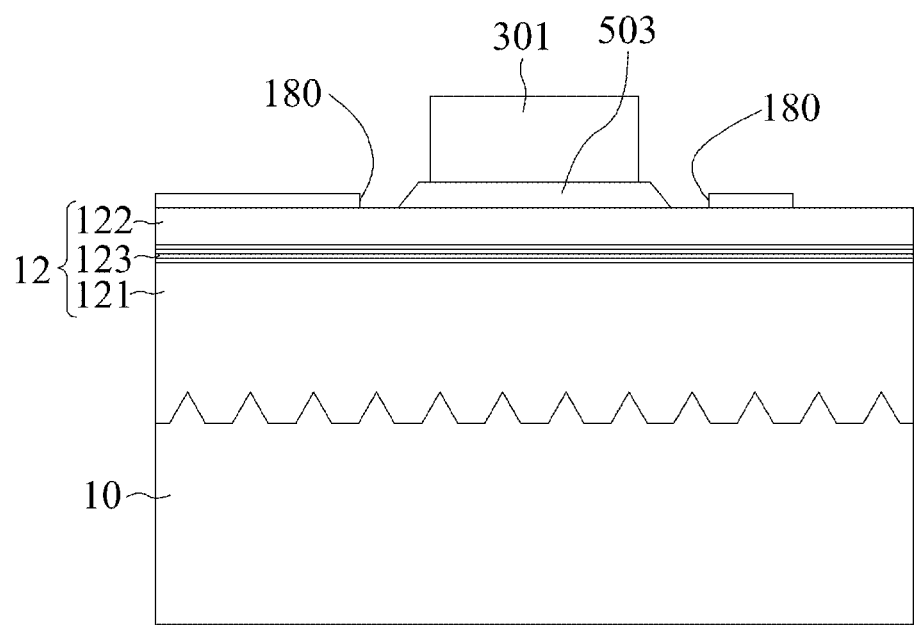

FIGS. 4A to 4C respectively show the cross-sectional views along line A-A' of the light-emitting device 1 in FIG. 1, in accordance with different embodiments of the present application. Moreover, FIG. 4A further shows an enlarged view of the partial region R. The difference between the different embodiments in FIGS. 4A to 4C and the first embodiment is that the second core region 501 of the second current blocking region 50 has no opening exposing the second semiconductor layer 122.

In one embodiment, as shown in FIG. 4A, the width of the opening 180 of the transparent conductive layer 18 is smaller than the width of the second core region 501 and larger than the width of the second pad electrode 301. The transparent conductive layer 18 covers the top surface of the second semiconductor layer 122, the extending regions 502 of the second current blocking region 50 and partial top surface of the second core region 501. Because the width of the opening 180 of the transparent conductive layer 18 is larger than the width of the second pad electrode 301, the transparent conductive layer 18 does not contact the second pad electrode 301. In one embodiment, a distance D between an edge of the second core region 501 and the opening 180 ranges from 1 to 10 μm. Since the whole bottom area of the second pad electrode 301 contacts the second core region 501 of the second current blocking region 50, and adhesion between the second pad electrode 301 and the second current blocking region 50 is stronger than that between the second pad electrode 301 and the transparent conductive layer 18, the second pad electrode is prevented from peeling off the light-emitting device 1. The yield and reliability of the light-emitting device 1 are improved. Furthermore, the transparent conductive layer 18 that does not contact the second pad electrode 301 can further prevent current directly flow into the second semiconductor layer 122 adjacent to the second pad electrode 301 via the contact between the transparent conductive layer 18 and the second pad electrode 301. In other words, less light or no light can be emitted by the semiconductor stack 12 adjacent to the second pad electrode 301 to be absorbed by the second pad electrode 301, and the current can be efficiently used.

In one embodiment, as shown in FIG. 4B, the width of the opening 180 of the transparent conductive layer 18 is substantially equal to the width of the second core region 501. The transparent conductive layer 18 does not contact the top surface of the second core region 501 of the second current blocking region 50. In one embodiment, as shown in FIG. 4C, the width of the opening 180 of the transparent conductive layer 18 is larger than the width of the second core region 501. The transparent conductive layer 18 neither contacts the top surface nor the side surface of the second core region 501.

Figure 5:
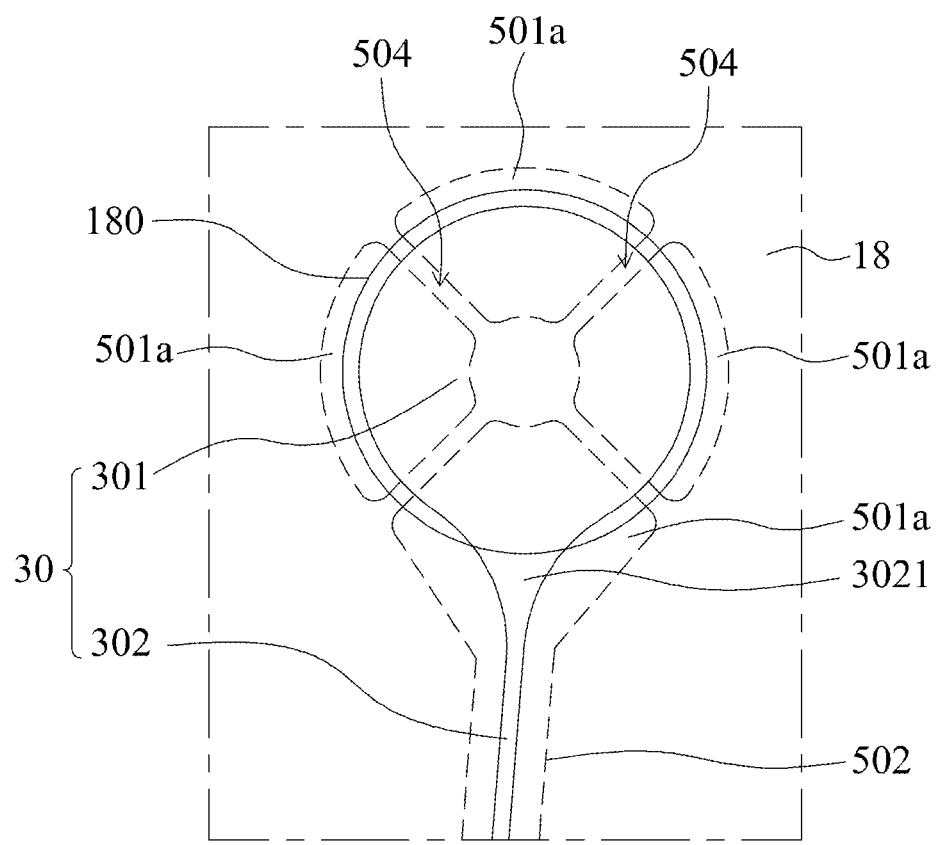
FIG. 5 shows a partial top view of the light-emitting device 1 in FIG. 1, in accordance with a different embodiment of the present application.

FIG. 5 is a partial top view of the light-emitting device 1 showing a different design for the second electrode 30 and the second current blocking region 50, in accordance with different embodiments of the present application As shown in FIG. 5, the second core region 501 and the second pad electrode 301 have different shapes in top view. The second core region 501 of the second current blocking region 50 includes a plurality of islands 501a separated with each other by slits 504. The transparent conductive layer 18 covers the extending region 502 and parts of the second core region 501 of the second current blocking region 50 and includes an opening 180 exposing a portion of a top surfaces of the islands 501a. In one embodiment, the transparent conductive layer 18 contacts the second semiconductor layer 122 via the slits 504. The second pad electrode 301 is formed on the plurality of islands 501a and contacts the second semiconductor layer 122 via the slits 504. In one embodiment, the extending region 502 of the second current blocking region 50 connects to one of the island 501a. In another embodiment, the extending region 502 of the second current blocking region 50 is divided from the second core region 501. The extending region 502 does not connect to any one of the island 501a.

In one embodiment, the second finger electrode 302 includes a first connecting portion 3021 extending from the periphery of the second pad electrode 301, and connecting the second pad electrode 301 and the other portion of the second finger electrode 302. The first connecting portion 3021 is formed above the second current blocking region 50 and the transparent conductive layer 18. To be more specific, one part of the first connecting portion 3021 is formed beyond the opening 180 of the transparent conductive layer 18, and the other part of the first connecting portion 3021 is formed in the opening 180 of the transparent conductive layer 18. The width of the first connecting portions 3021 is wider than other portion of the second finger electrode 302. The width of the first connecting portions 3021 is smaller than a width of the second pad electrode 301. The first connecting portion 3021 of the second finger electrode 302 includes wider widths and larger areas can allow higher current pass through to avoid electrostatic discharge (ESD) or Electrical Over Stress (EOS) damage.

Figure 6:
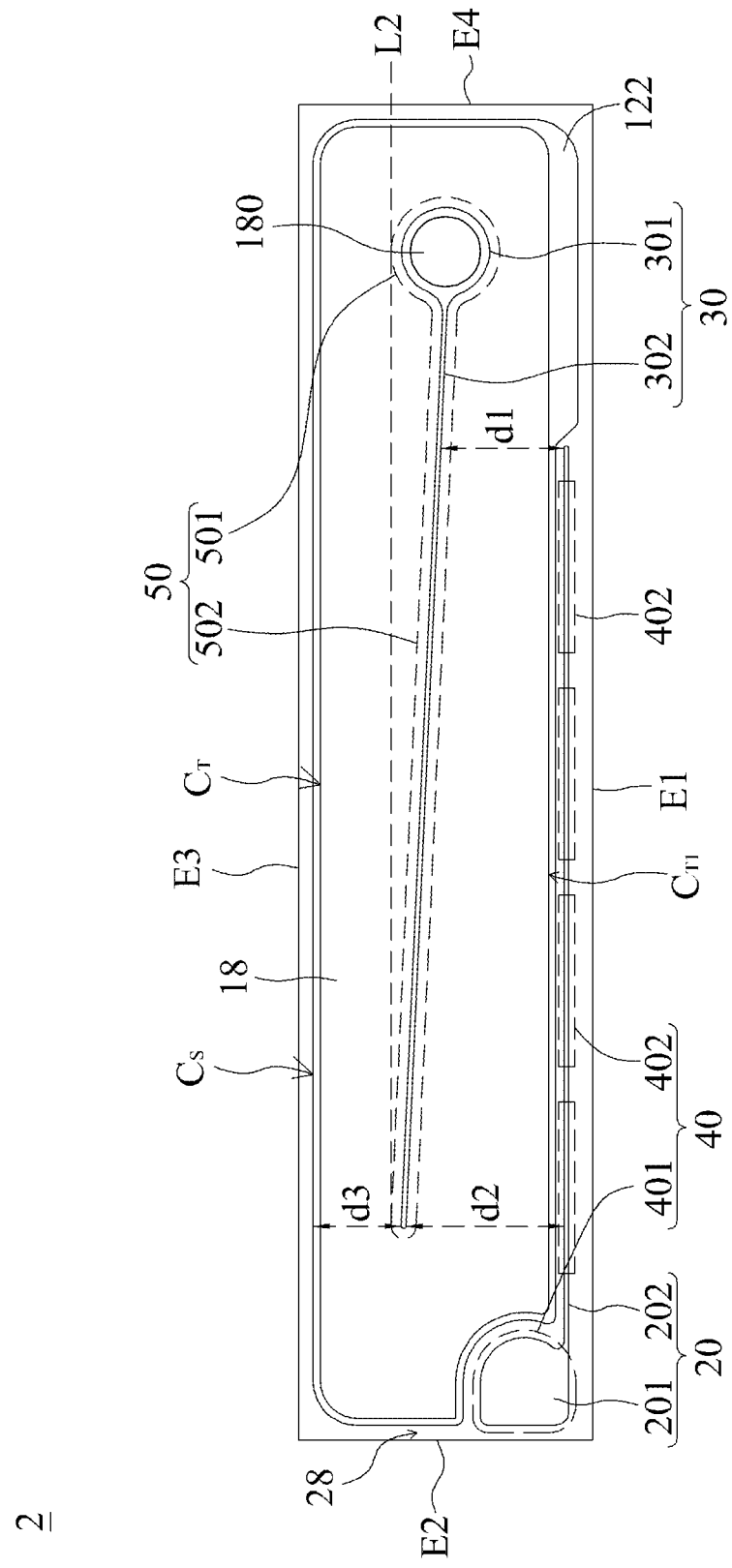
FIG. 6 shows a top view of a light-emitting device 2 in accordance with a second embodiment of the present application.

FIG. 6 shows a top view of the light-emitting device 2 in accordance with the second embodiment of the present application.

As shown in FIG. 6, the light-emitting device 2 includes a substrate 10, a semiconductor stack 12 on the substrate 10, a first and a second current blocking regions 40 and 50 on the semiconductor stack 12, a transparent conductive layer 18 on the semiconductor stack 12, a first electrode 20, a second electrode 30, and a protective layer (not shown) having openings to expose the first electrode 20 and the second electrode 30. The structure of the light-emitting device 2 is similar with that described in the first embodiment. The structures of the first pad electrode 201, the first current blocking region 40 including a first core region 401 and the plurality of separated islands 402, the second pad electrode 301, the transparent conductive layer 18 and the second core region 501 and the second extending region 502 of the second current blocking region 50 described in the above embodiments can be applied in the light-emitting device 2. The differences between the light-emitting device 2 and the light-emitting device 1 are described as below.

In this embodiment, the first pad electrode 201 is located at a corner intersected by the first edge E1 and the second edge E2. The first current blocking region 40 includes the first core region 401 between the first pad electrode 201 and the first semiconductor layer 121. The first core region 401 has an area larger than that of the first pad electrode 201 so that the first pad electrode 201 does not physically contact the first semiconductor layer 121.

The second finger electrode 302 is not parallel with the first finger electrodes 202, the first edge E1 and/or the third edge E3. To be more specific, each of the first finger electrode 202 and the second finger electrode 302 includes an overlapping portion, and the overlapping portions of the first finger electrode 202 and the second finger electrode 302 are non-parallel. A distance between the first finger electrode 202 and the second finger electrode 302 is varied along a direction that the second finger electrode 302 extending toward the first pad electrode 201. In one embodiment, the distance between the overlapping portions increases as a distance that the second finger electrode 302 extends far away from the second pad electrode 301. In one embodiment, as shown in FIG. 6, the distance d1 is the shortest distance between the overlapping portions. In one embodiment, the shortest distance d1 is between the second finger electrode 302 and the end of the first finger electrode 202. In one embodiment, the distance d2 is the largest distance between the overlapping portions. In one embodiment, the distance d3 is the shortest distance between the end of second finger electrode 302 and the contour $C_S$ of the second semiconductor layer 122 or the shortest distance between the second finger electrode 302 and the contour $C_S$ of the second semiconductor layer 122. In this embodiment, the distance d2 is greater than the distance d1, and the distance d2 is greater than the distance d3. In one embodiment, the distance d3 is smaller than 90 μm. In another embodiment, the distance d2 is greater than a half of a length of the second edge E2. The distance between the second finger electrode 302 and the sub-contour $C_{T1}$ of the transparent conductive layer 18 near the first edge E1 gradually increases along a direction that the second finger electrode 302 extends away from the second pad electrode 301.

The dash line L2 in FIG. 6 represents a tangent to the second pad electrode 301 which is parallel with and adjacent to the third edge E3. In one embodiment, the end of the second finger electrode 302 does not extend beyond the dash line L2. In this way, the end of the second finger electrode 302 does not get too close to the contour $C_S$ of the second semiconductor layer 122 near the third edge E3, and the current spreading within an area between the end of the second finger electrode 302, the second and the third edges E2 and E3 is as uniform as other areas of the light-emitting device 2.

Figure 7:
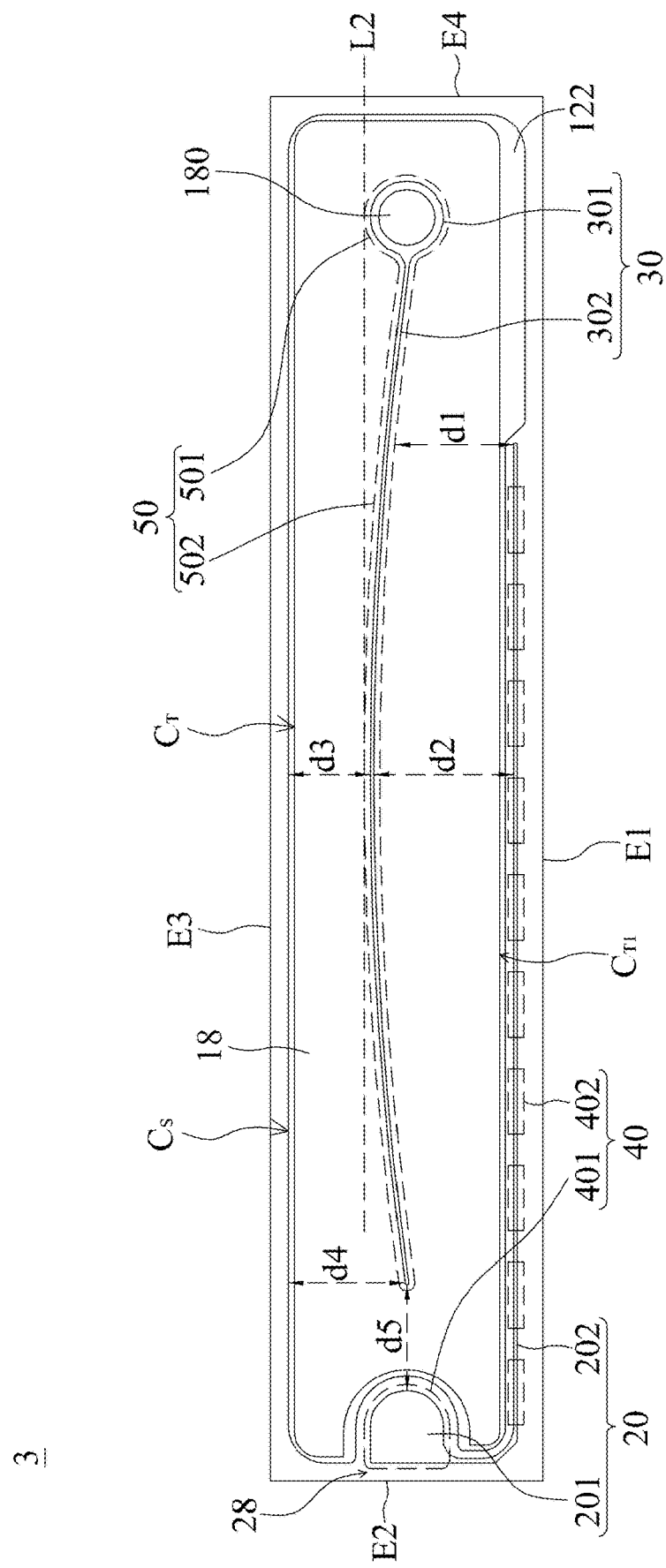
FIG. 7 shows a top view of a light-emitting device 3 in accordance with a third embodiment of the present application.

FIG. 7 shows a top view of the light-emitting device 3 in accordance with the third embodiment of the present application.

As shown in FIG. 7, the light-emitting device 3 includes a substrate 10, a semiconductor stack 12 on the substrate 10, a first and a second current blocking regions 40 and 50 on the semiconductor stack 12, a transparent conductive layer 18 on the semiconductor stack 12, a first electrode 20, a second electrode 30, and a protective layer (not shown) having openings to expose the first electrode 20 and the second electrode 30. The structure of the light-emitting device 3 is similar with that described in the above embodiments. The differences between the light-emitting device 3 and the light-emitting device 2 are described as below.

In this embodiment, the second finger electrode 302 includes a curve. The second finger electrode 302 is not parallel with the first finger electrodes 202, the first edge E1 and/or the third edge E3. To be more specific, the overlapping portions of the first finger electrode 202 and the second finger electrode 302 are non-parallel. The second finger electrode 302 extends from the second pad electrode 301 and bends toward the third edge E3.

As shown in FIG. 7, the distance d1 is the shortest distance between the overlapping portions. In one embodiment, the shortest distance d1 is between the second finger electrode 302 and the end of the first finger electrode 202. In another embodiment, the shortest distance d1 is between the first finger electrode 202 and the end of the second finger electrode 302. The distance d2 is the largest distance between the overlapping portions. The distance d3 is the shortest distance between the second finger electrode 302 and the contour $C_S$ of the second semiconductor layer 122. The distance d4 is the shortest distance between the end of the second finger electrode 302 and the contour $C_S$ of the second semiconductor layer 122 which is parallel with the third edge E3. The distance d5 is the shortest distance between the end of the second finger electrode 302 and the first pad electrode 201. The dash line L2 represents a tangent to the second pad electrode 301 which is adjacent to and parallel with the third edge E3.

In one embodiment, the distance d2 is greater than the distance d1, the distance d2 is greater than the distance d3 and the distance d2 is greater than a haft of the length of the second edge E2. In one embodiment, the distance d3 is smaller than 90 μm. In another embodiment, the distance d4 and the distance d5 are substantially the same so that current spreading around an area between the first pad electrode 201 and the third edge E3 is as uniform as the current spreading at other areas, such as areas between the first finger electrode 202 and the second finger electrode 302. In another embodiment, the second finger electrode 302 does not extend beyond the dash line L2. In one embodiment, the bend portion of the second finger electrode 302 does not extend beyond the dash line L2.

Figure 8:
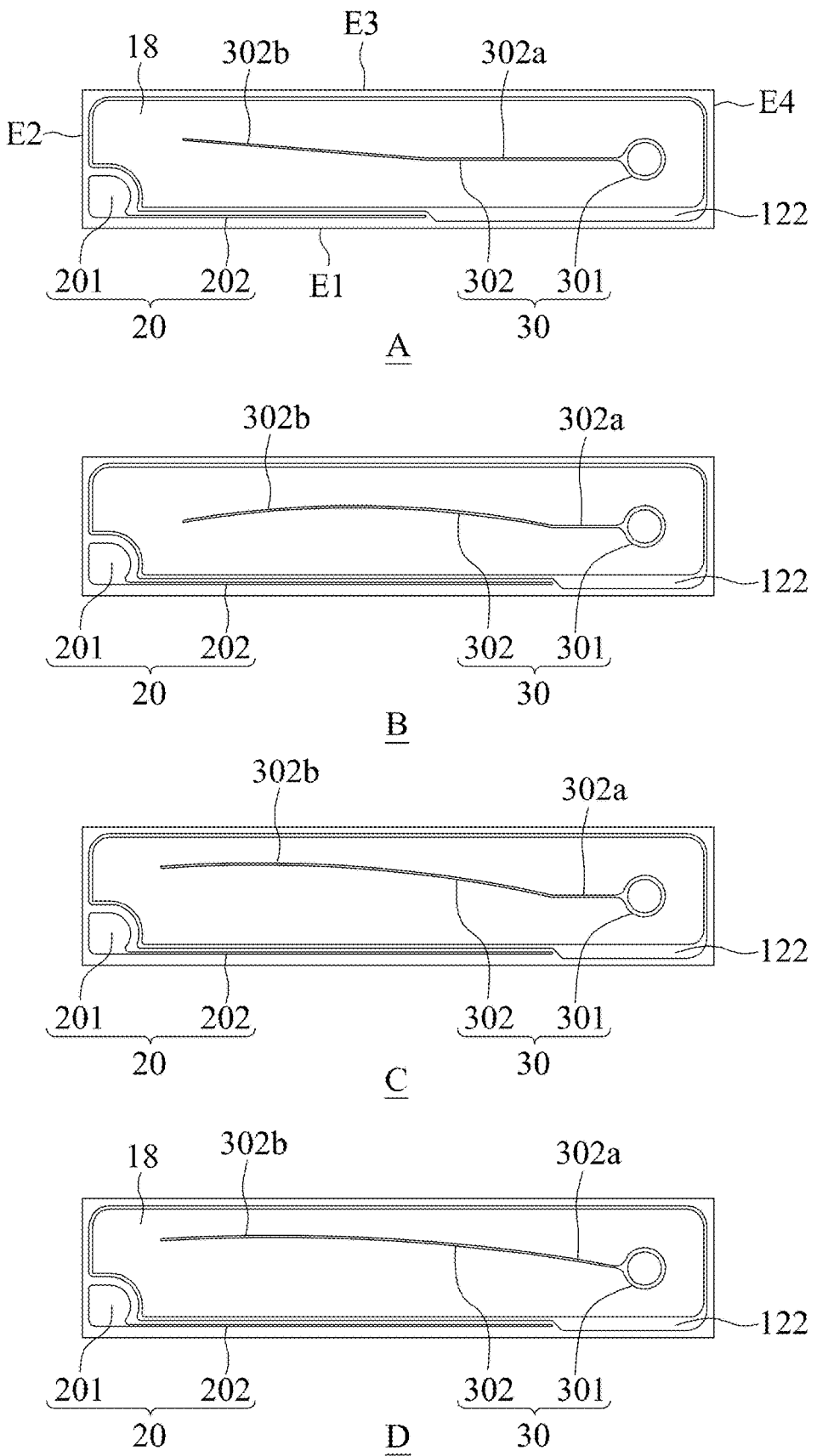
FIG. 8 shows top views of the light-emitting devices in accordance with different embodiments of the present application.

FIG. 8 shows the light emitting devices A-D for the second electrode 30 in accordance with variant embodiments of the present application. The structures of the light-emitting devices in FIG. 8 are similar with that described in the above embodiments. In order to clearly show the electrode layout, the first and the second current blocking regions are not shown in FIG. 8.

In each of the embodiments, as shown in the variant light emitting devices A-D in FIG. 8, the second finger electrode 302 includes a first portion 302a not overlapping with the first finger electrode 202 and a second portion 302b overlapping with the first finger electrode 202. In one embodiment, the first portion 302a of the second finger electrode 302 is parallel to the first finger electrode 202, the first edge E1 and/or the third edge E3. In one embodiment, the first portion 302a of the second finger electrode 302 is not parallel to the first finger electrode 202, the first edge E1 or the third edge E3. In one embodiment, the second portion 302b of the second finger electrode 302 is not parallel to the first finger electrode 202, the first edge E1 and/or the third edge E3.

In the light emitting device A, the second portion 302b of the second finger electrode 302 is linear and the first portion 302a is parallel with the first edge E1. In the variant light emitting devices B and C, the second portions 302b of the second finger electrodes 302 are curves. In the light emitting device D, whole second finger electrode 302 is a curve. The shortest distance between the end of the second finger electrode 302 and the first finger electrode 202 is larger than the shortest distance between the end of the first finger electrode 202 and the second finger electrode 302.

Figure 9:
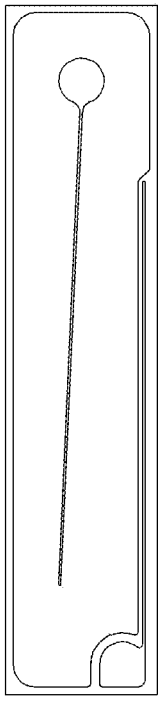
FIG. 9 is a schematic plan view showing current density of the light-emitting device in accordance with the second embodiment of the present application and a light-emitting device of a comparative example.

FIG. 9 is schematic plan views and near filed emission intensity images of the light-emitting device in accordance with the second embodiment of the present application and a light-emitting device of the Comparative Example. Both the light-emitting devices of the second embodiment and the Comparative Example have the same size. The near filed emission intensity images are taken with 20 mA current injection for each light-emitting device, respectively. The near filed emission intensity images show the distributions of current and current density in the light-emitting devices. In order to clearly show the difference between the electrode layouts of the two light-emitting devices, the current blocking regions and the transparent conductive layer are not shown in FIG. 9. In FIG. 9, the shade indicates the distribution of current and brightness, and the darker shade indicates a region with higher current density and higher brightness. A region with a uniform shade indicates that current in this region of the light-emitting device is uniform.

As shown in FIG. 9, the light-emitting devices in the second embodiment and the Comparative Example include a pair of finger electrodes and a pair of pad-electrode respectively. The first and the second fingers, pad electrodes are formed on the first semiconductor layer 121 and the second semiconductor layer 122 respectively. The first semiconductor layer 121 is an n-type semiconductor, and the second semiconductor layer 122 is a p-type semiconductor. So the first and the second finger electrodes are an n-finger electrode formed on the n-type semiconductor and a p-finger electrode formed on the p-type semiconductor respectively. The first and the second pad electrodes are an n-pad electrode and a p-pad electrode respectively. The p-finger electrode and the n-finger electrode of light-emitting devices in the Comparative Example are parallel with each other. Besides, a distance between the contour of the transparent conductive layer (not shown) and the contour of the second semiconductor layer is substantially a constant. Referring to the Comparative Example shown in FIG. 9, brightness and current density are relatively high in some local areas near the end of the p-finger electrode. In contrast, brightness and current density are relatively low in the region between the p-pad electrode and the end of the n-finger electrode. This phenomenon shows that current is crowded near the end of the p-finger electrode, and current distribution in the Comparative Example is not uniform.

Referring to the light-emitting device of the second embodiment shown in FIG. 9, the finger electrodes are non-parallel. The region between the end of the first finger electrode and the fourth edge E4 opposite to the first pad electrode is not covered by the transparent conductive layer as described in above embodiments. Current crowding is restrained, and the uniformity of current is better in the second embodiment in accordance with the present application than that of the Comparative Example. The power of the light-emitting device of the present application is improved due to the uniformity of current distribution. Moreover, a uniform current distribution may reduce localized heating due to the current crowding so that the lifetime of the light-emitting device can be extended.

FIG. 10 shows the optical output power (Po) and the forward voltage (Vf) of the light-emitting device according to the second embodiment and the light-emitting device A according to the embodiment shown in FIG. 8 and a light-emitting device of the Comparative Example. In FIG. 10, the first and the second current blocking regions are not shown.

With reference to FIG. 10, the light emitting device of the second embodiment exhibits a 1.125% increase in output power, as compared to the Comparative Example. The light emitting device of the variant example A shown in FIG. 8 exhibits a 0.726% increase in output power, as compared to the Comparative Example, and a decrease of 0.025V in forward voltage (VF), as compared to Comparative Example.

Figure 11A:
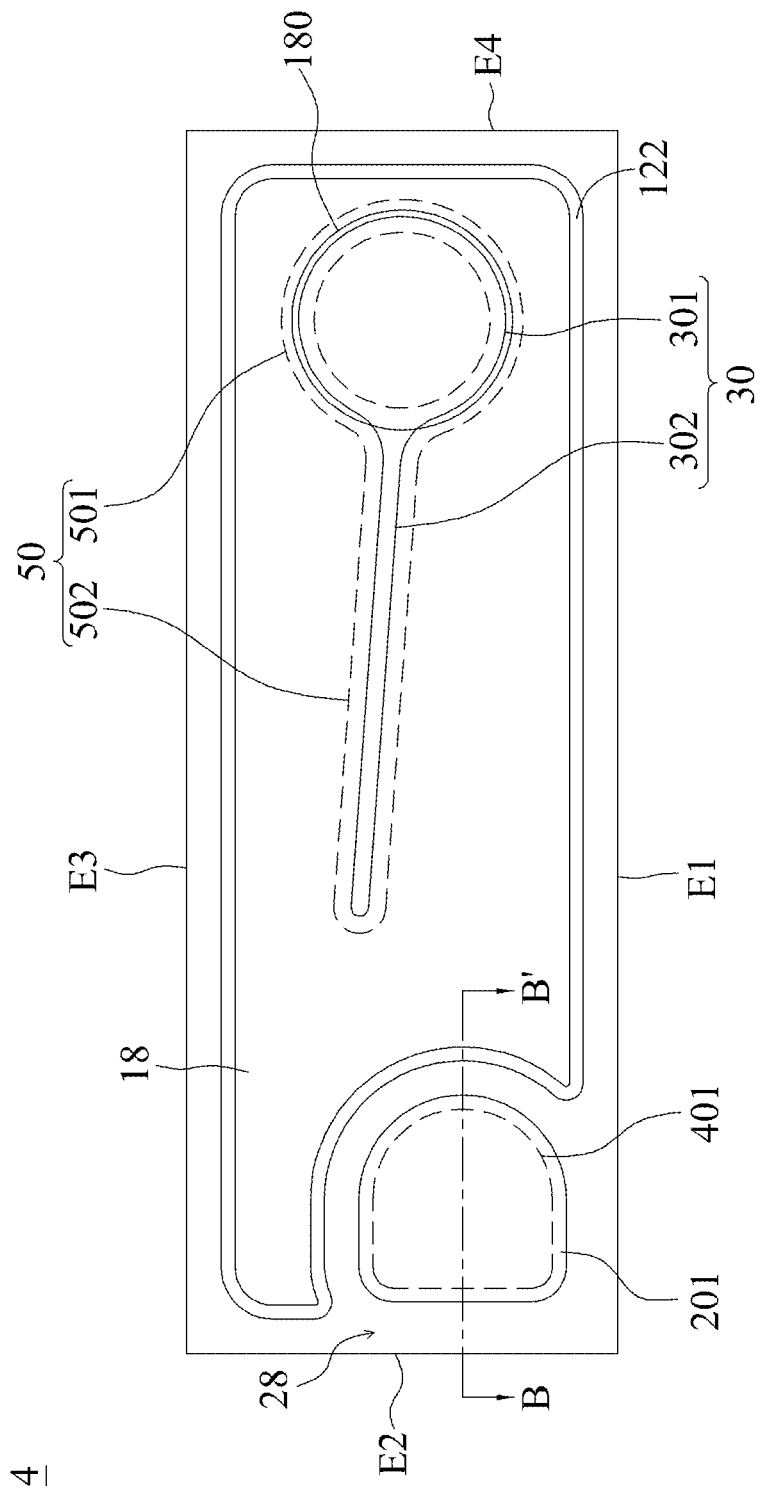
FIG. 11A shows a top view of a light-emitting device 4 in accordance with a fourth embodiment of the present application.
Figure 11B:
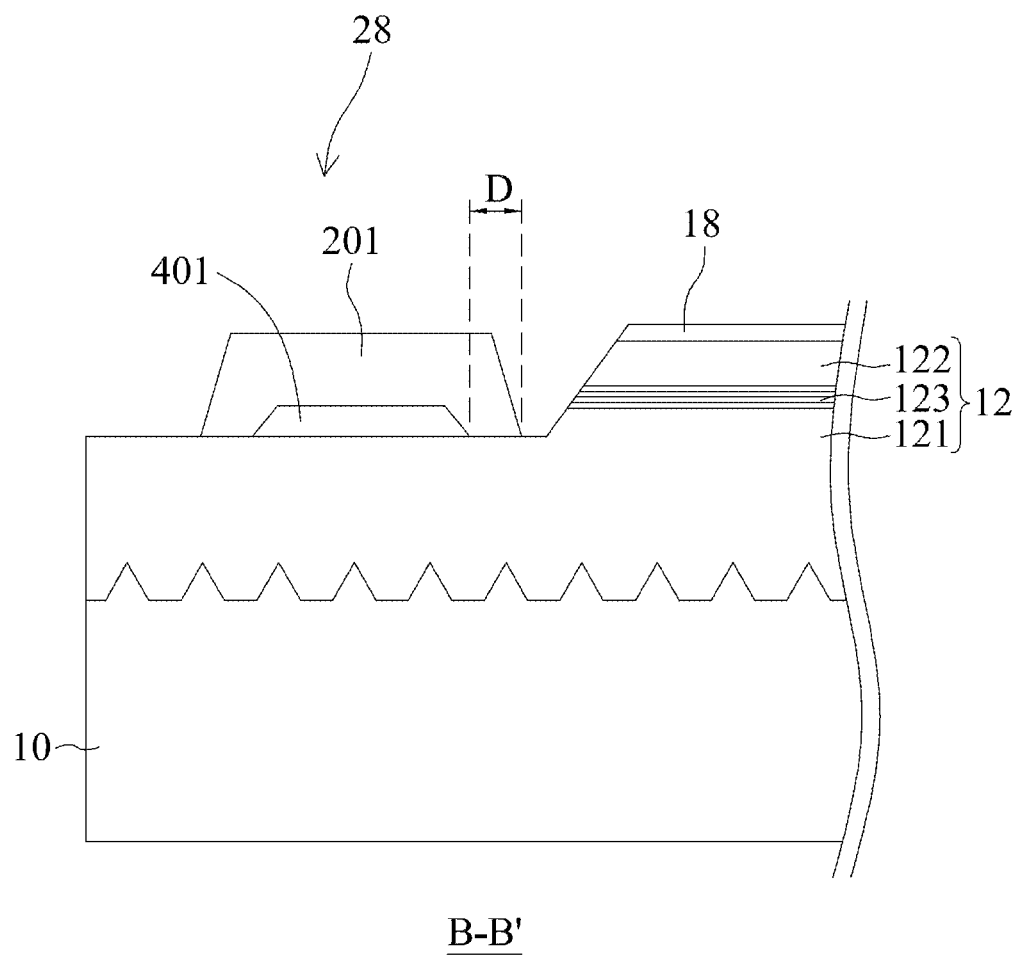
FIG. 11B shows a partial cross-sectional view taken along the line B-B' of the light-emitting device 4 in FIG. 11A.

FIG. 11A shows a top view of the light-emitting device 4 in accordance with the fourth embodiment of the present application. FIG. 11B shows a cross-sectional view taken along the line B-B' of the light-emitting device 4 in FIG. 11A. The light-emitting device 4 includes a substrate 10, a semiconductor stack on the substrate 10, a first core region 401 of a first current blocking region and a second current blocking region 50 on the semiconductor stack, a transparent conductive layer 18 on the semiconductor stack, a first electrode includes a first pad electrode 201, a second electrode 30 including a second pad electrode 301 and a second finger electrode 302, and a protective layer (not shown) having openings to expose the first pad electrode 201 and the second pad electrode 301. The structure of the light-emitting device 4 is similar with that described in the second embodiment. The differences between the light-emitting device 4 and the light-emitting device 2 are described as below.

The first electrode which electrically connects the first semiconductor layer 121 includes the first pad electrode 201 devoid of finger electrode extending therefrom. The first pad electrode 201 is located at the side of the second edge E2. The side of the second edge E2 includes several embodiments. In one embodiment, the first pad electrode 201 is located at the second edge E2. In one embodiment, the first pad electrode 201 is located at a corner intersected by the first edge E1 and the second edge E2. In one embodiment, the first pad electrode 201 is located at the second edge E2 and adjacent to the corner intersected by the first edge E1 and the second edge E2. The first core region 401 of the first current blocking region is formed between the first semiconductor layer 121 and the first pad electrode 201. The first core region 401 of the first current blocking region has a width smaller than that of the first pad electrode 201. Therefore, as shown in FIG. 11B, the first pad electrode 201 physically contacts an area of the first semiconductor layer 121 outside of the first core region 401. In one embodiment, the contour of the first pad electrode 201 exceeds the contour of the first core region 401 more than 2 µm. That is, a distance D between the edges of the first pad electrode 201 and the first core region 401 is more than 2 µm to assure a sufficient contact area between the first pad electrode 201 and the first semiconductor layer 121. In one embodiment, the distance D ranges from 2-15 µm.

The first core region 401 of the first current blocking region below the first pad electrode 201 prevents the current from being directly injected into the semiconductor layer under the pad electrode, so that the current is forced to spread laterally. Another advantage that a light emitting device with a current blocking region is that light emitted from the active layer 123 can be extracted by the current blocking region and then brightness of the light emitting device can be enhanced. However, a larger blocking region means a less contact area between electrodes and the semiconductor stack, and then the electric characteristics, such as forward voltage (Vf) of the light emitting device, might be affected. The area, position or layout of the current blocking region is a tradeoff according to brightness and electric characteristics of the light emitting device. As shown in the light-emitting device 1 of the first embodiment, the first core region 401 which has a larger area than that of the first pad electrode 201 benefits brightness. As shown in the fourth embodiment, the light-emitting device 4 has the semiconductor stack 12 with a smaller area than that of the light-emitting device 1 and has no first finger electrodes, setting the first core region 401 to have an area smaller than that of the first pad electrode 201 to increase the contact area between the first semiconductor layer 121 and the first electrode 20, so that the forward voltage (Vf) can be decreased.

In one embodiment, the second pad electrode 301 is located at the side of the fourth edge E4. The side of the fourth edge E4 includes several embodiments. In one embodiment, the second pad electrode 301 is located at the fourth edge E4. In one embodiment, the second pad electrode 301 is located adjacent to the fourth edge E4. The second finger electrode 302 extends from the second pad electrode 301 toward the second edge E2 along a direction which is not parallel with the first edge E1 and the third edge E3. A distance between the second finger electrode 302 and the first edge E1 increases as a distance that the second finger electrode 302 extends far away from the second pad electrode 301. The second finger electrode 302 points to an area intersected by the second edge E2 and the third edge E3. As a result, current distribution in an area between the first pad electrode 201 and the third edge E3 is as uniform as current distribution in other area of the light-emitting device 4.

Figure 12:
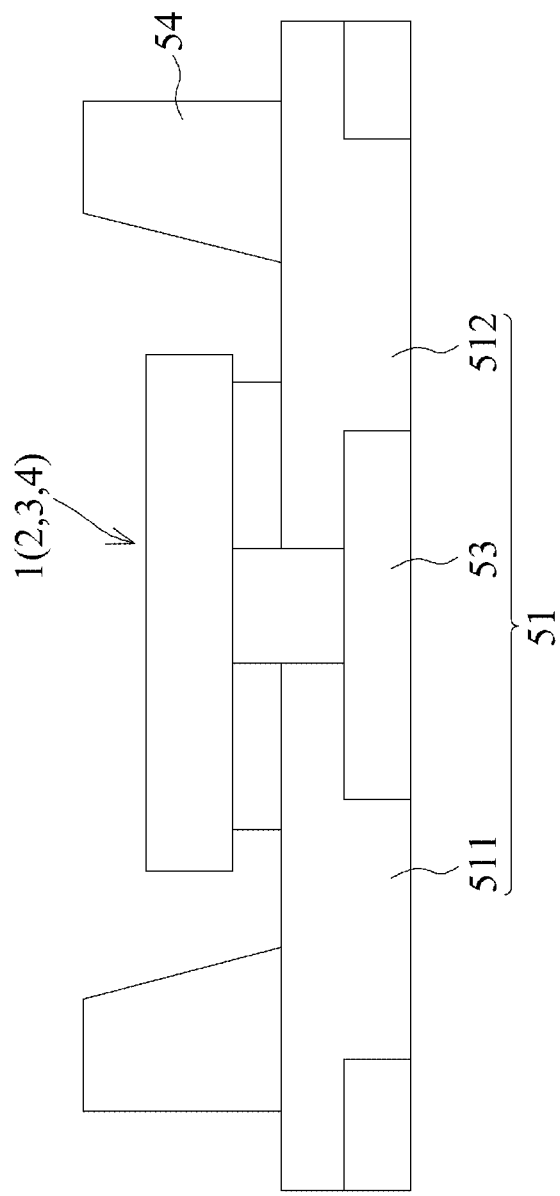
FIG. 12 shows a light-emitting apparatus 6 in accordance with an embodiment of the present application.

FIG. 12 shows a light-emitting apparatus 6 in accordance with an embodiment of the present invention. Any of the light-emitting devices in the aforementioned embodiments is mounted on the first conductive pad 511 and the second conductive pad 512 of the carrier 51. The first conductive pad 511 and the second conductive pad 512 are electrically insulated with each other by an insulating part 53 composed of an insulating material. The light-emitting device is flipped mounted on the carrier 51. The surface of the growth substrate which is opposite to the first electrode and the second electrode is faced up and functions as a light extraction surface. In order to increase the light extraction efficiency of the light emitting device, a reflective structure 54 is disposed around the light-emitting device.

Figure 13:
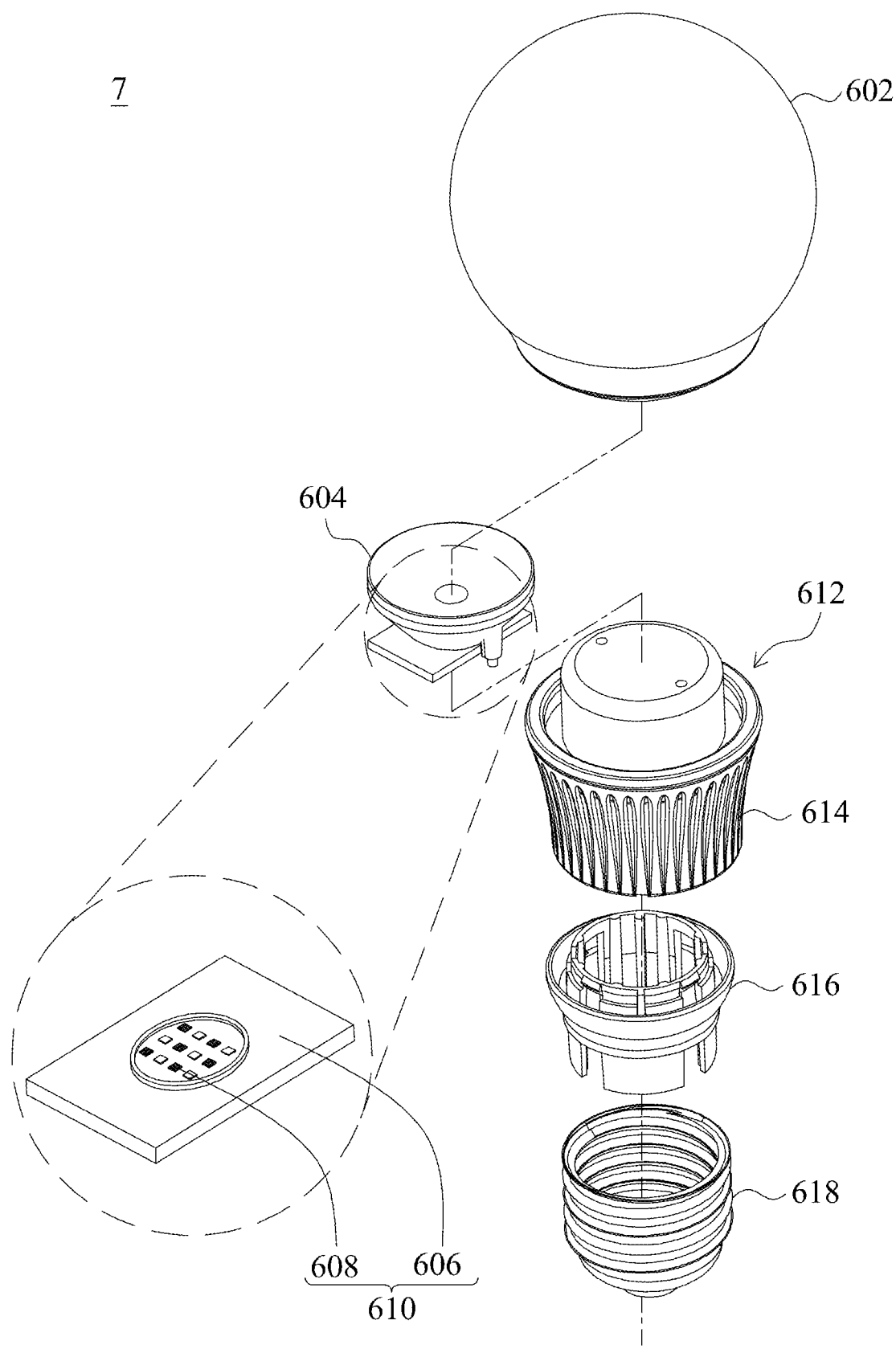
FIG. 13 shows a light-emitting apparatus 7 in accordance with an embodiment of the present application.

FIG. 13 shows a light-emitting apparatus 7 in accordance with an embodiment of the present invention. The light-emitting apparatus 7 is a light bulb including a cover 602, a reflector 604, a light-emitting module 610, a lamp holder 612, a heat sink 614, a connecting portion 616, and an electrical connecting element 618. The light-emitting module 610 includes a carrier part 606 and a plurality of light-emitting units 608 disposed on the carrier part 606. The plurality of light-emitting units 608 can be any of the light-emitting devices or the light-emitting apparatus 6 in the aforementioned embodiments.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting device, comprising:
    a substrate, comprising a first edge, a second edge, a third edge and a fourth edge, wherein the first edge and the third edge are opposite each other, and the second edge and the fourth edge are opposite each other;
    a semiconductor stack formed on the substrate, comprising a first semiconductor layer, a second semiconductor layer and an active layer formed therebetween;

a first electrode formed on the first semiconductor layer, comprising a first pad electrode and a first finger electrode extending from the first pad electrode; and a second electrode formed on the second semiconductor layer, comprising a second pad electrode and a second finger electrode extending from the second pad electrode;

wherein the first finger electrode is disposed at and along the first edge; and wherein in a top view, the first finger electrode comprises a first overlapping portion overlapping the second finger electrode;

the second finger electrode comprises a second overlapping portion overlapping the first finger electrode and a non-overlapping portion that does not overlap the first finger electrode; and the second overlapping portion is not parallel with the first overlapping portion and the non-overlapping portion is not parallel with the first edge.

2. The light-emitting device according to claim 1, wherein the non-overlapping portion comprises a first end that connects the second pad electrode and a second end that connects the second overlapping portion; and a distance between the first end and the first edge is smaller than a distance between the second end and the first edge.

3. A light-emitting device, comprising:

a substrate, comprising a first edge, a second edge, a third edge and a fourth edge, wherein the first edge and the third edge are opposite each other, and the second edge and the fourth edge are opposite each other;

a semiconductor stack formed on the substrate, comprising a first semiconductor layer, a second semiconductor layer and an active layer formed therebetween;

a first electrode formed on the first semiconductor layer, comprising a first pad electrode and a first finger electrode extending from the first pad electrode; and a second electrode formed on the second semiconductor layer, comprising a second pad electrode and a second finger electrode, and wherein the second finger electrode comprises a first end connecting the second pad electrode and a second end, and extends from the first end toward the second end in an extending direction;

wherein the first finger electrode is disposed at and along the first edge; and wherein in a top view, a distance between the first edge and the second finger electrode, from the first end to the second end, increases along the extending direction.

4. The light-emitting device according to claim 3, further comprising a current blocking region between the first electrode and the first semiconductor layer.

5. The light-emitting device according to claim 4, wherein the current blocking region comprises a plurality of islands under the first finger electrode.

6. The light-emitting device according to claim 5, further comprising:

an exposed region extending from a top surface of the second semiconductor layer downward to the first semiconductor layer and exposing a top surface of the first semiconductor layer;

wherein the first electrode is formed on the top surface of the first semiconductor layer and a shortest spacing between one of the islands and a side surface of the exposed region is not smaller than 1 μm.

7. The light-emitting device according to claim 3, further comprising a current blocking region under the second electrode;

wherein the current blocking region comprises a core region comprising a plurality of islands under the second electrode pad.

8. The light-emitting device according to claim 7, wherein the current blocking region further comprises an extending region under the second finger electrode and the extending region does not connect to any one of the island.

9. The light-emitting device according to claim 3, further comprising a current blocking region under the second electrode and a transparent conductive layer formed on the second semiconductor layer and the current blocking region; wherein:

the current blocking region comprises a core region under the second electrode pad;

the transparent conductive layer comprises a first opening exposing the core region; and a distance between an outer edge of the core region and the first opening ranges from 1 μm to 10 μm.

10. The light-emitting device according to claim 3, further comprising a current blocking region under the second electrode and a transparent conductive layer formed on the second semiconductor layer and the current blocking region; wherein:

the current blocking region comprises a core region under the second electrode pad; and the transparent conductive layer comprises an opening exposing the core region and a width of the first opening is larger than that of the second pad electrode.

11. The light-emitting device according to claim 3, further comprising a transparent conductive layer on the second semiconductor layer; wherein an area of the second semiconductor layer between the fourth edge and an end of the first finger electrode is not covered by the transparent conductive layer.

12. A light-emitting device, comprising:

a first edge, a second edge, a third edge and a fourth edge, wherein the first edge and the third edge are opposite each other, and the second edge and the fourth edge are opposite each other;

a substrate;

a semiconductor stack formed on the substrate, comprising a first semiconductor layer, a second semiconductor layer and an active layer formed therebetween;

a transparent conductive layer, formed on the second semiconductor layer;

a first electrode formed on the first semiconductor layer, comprising a first pad electrode and a first finger electrode extending from the first pad electrode; and a second electrode formed on the second semiconductor layer, comprising a second pad electrode and a second finger electrode extending from the second pad electrode;

wherein the first edge and the third edge are longer than the second edge and the fourth edge, and the first finger electrode and the second finger electrode extend toward the fourth edge and the second edge, respectively;

wherein in a top view, the first finger electrode is disposed at and along the first edge;

the second semiconductor layer comprises an contour, and the contour comprises a first sub-contour adjacent to and parallel with the first finger electrode and a second sub-contour connecting to the first sub-contour and adjacent to the first edge; and a distance between the transparent conductive layer and the first sub-contour is smaller than a distance between the transparent conductive layer and the second sub-contour.

13. The light-emitting device according to claim 12, wherein an area of the second semiconductor layer between the second sub-contour and a pseudo extending line of the first sub-contour is not covered by the transparent conductive layer.

14. The light-emitting device according to claim 13, wherein the pseudo extending line of the first sub-contour is between the first edge and the transparent conductive layer.

15. The light-emitting device according to claim 12, wherein the contour further comprises a third sub-contour adjacent to the third edge; and the distance between the transparent conductive layer and the second sub-contour is greater than a distance between the transparent conductive layer and the third sub-contour.

16. The light-emitting device according to claim 12, wherein the first pad electrode is disposed at the second edge and the first finger electrode extends along the second edge and the first edge.

17. The light-emitting device according to claim 12, wherein the transparent conductive layer comprises an opening corresponding to a location of the second pad electrode and a width of the opening is larger than that of the second pad electrode.

18. The light-emitting device according to claim 12, further comprising a current blocking region under the second pad electrode.

19. The light-emitting device according to claim 12, wherein an area of the transparent conductive layer is smaller than 93% of an area of the second semiconductor layer in a top view.

20. The light-emitting device according to claim 12, wherein the second finger electrode comprises a second overlapping portion overlapping the first finger electrode and a non-overlapping portion that does not overlap the first finger electrode; and the second overlapping portion is not parallel with the first overlapping portion.

\* \* \* \* \*